United States Patent
Yoshihara et al.

(10) Patent No.: US 9,878,267 B2
(45) Date of Patent: Jan. 30, 2018

(54) SOLUTION TREATMENT APPARATUS AND SOLUTION TREATMENT METHOD

(71) Applicant: Tokyo Electron Limited, Tokyo (JP)

(72) Inventors: Kousuke Yoshihara, Koshi (JP); Katsunori Ichino, Koshi (JP); Toshinobu Furusho, Koshi (JP); Takashi Sasa, Koshi (JP); Katsuhiro Tsuchiya, Tokyo (JP); Yuichi Terashita, Koshi (JP); Hirofumi Takeguchi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/639,010

(22) Filed: Jun. 30, 2017

(65) Prior Publication Data

US 2017/0296944 A1  Oct. 19, 2017

Related U.S. Application Data

(62) Division of application No. 14/378,337, filed as application No. PCT/JP2013/054517 on Feb. 22, 2013, now Pat. No. 9,731,226.

(30) Foreign Application Priority Data

Feb. 27, 2012 (JP) .................................. 2012-039538
Dec. 28, 2012 (JP) .................................. 2012-288515

(51) Int. Cl.
*B01D 46/46* (2006.01)
*B01D 53/30* (2006.01)
(Continued)

(52) U.S. Cl.
CPC ..... *B01D 19/0063* (2013.01); *B01D 19/0031* (2013.01); *B01D 19/0068* (2013.01);
(Continued)

(58) Field of Classification Search
None
See application file for complete search history.

(56) References Cited

U.S. PATENT DOCUMENTS

| 6,126,725 A | 10/2000 | Tateyama |
| 2007/0177998 A1 | 8/2007 | Kato |

(Continued)

FOREIGN PATENT DOCUMENTS

| JP | 32-281727 A | 11/1990 |
| JP | H05-267149 A | 10/1993 |

(Continued)

OTHER PUBLICATIONS

International Search Report of the International Searching Authority dated May 7, 2013 for the corresponding International application No. PCT/JP2013/054517 (with English translation) in connection with related U.S. Appl. No. 14/378,337.

*Primary Examiner* — Amber R Orlando
*Assistant Examiner* — Phillip Y Shao
(74) *Attorney, Agent, or Firm* — Posz Law Group, PLC

(57) ABSTRACT

A solution treatment apparatus connected to a supply nozzle that supplies a treatment solution to a substrate, includes: a supply pipeline connecting a treatment solution storage container and the supply nozzle; a filter apparatus provided in the supply pipeline; a pump on a secondary side of the filter apparatus; a circulation pipeline connecting a discharge side of the pump and an intake side of the filter apparatus; a supply control valve provided in the supply pipeline on a secondary side of the pump; a circulation control valve provided in the circulation pipeline; and a control unit, wherein the control unit opens the circulation control valve and drives the pump when supply of the treatment solution from the supply nozzle to the substrate is stopped by closing the supply control valve, to thereby circulate the treatment (Continued)

solution between the supply pipeline having the filter apparatus and the circulation pipeline.

4 Claims, 22 Drawing Sheets

(51) Int. Cl.
    *B01D 19/00*     (2006.01)
    *G03F 7/16*     (2006.01)
    *H01L 21/67*     (2006.01)
    *G03F 7/30*     (2006.01)

(52) U.S. Cl.
    CPC .................. *G03F 7/16* (2013.01); *G03F 7/30* (2013.01); *H01L 21/6715* (2013.01)

(56) References Cited

U.S. PATENT DOCUMENTS

2011/0045195 A1     2/2011   Yoshihara
2013/0280425 A1   10/2013   Yoshida

FOREIGN PATENT DOCUMENTS

| | | |
|---|---|---|
| JP | 10-180173 A | 7/1998 |
| JP | 11-147068 A | 6/1999 |
| JP | 2000-012449 A | 1/2000 |
| JP | 2000-120530 A | 4/2000 |
| JP | 2001-332469 A | 11/2001 |
| JP | 2003-197513 A | 7/2003 |
| JP | 2010-135535 A | 6/2010 |
| TW | 455927 B | 9/2001 |

FIG.11
(a)
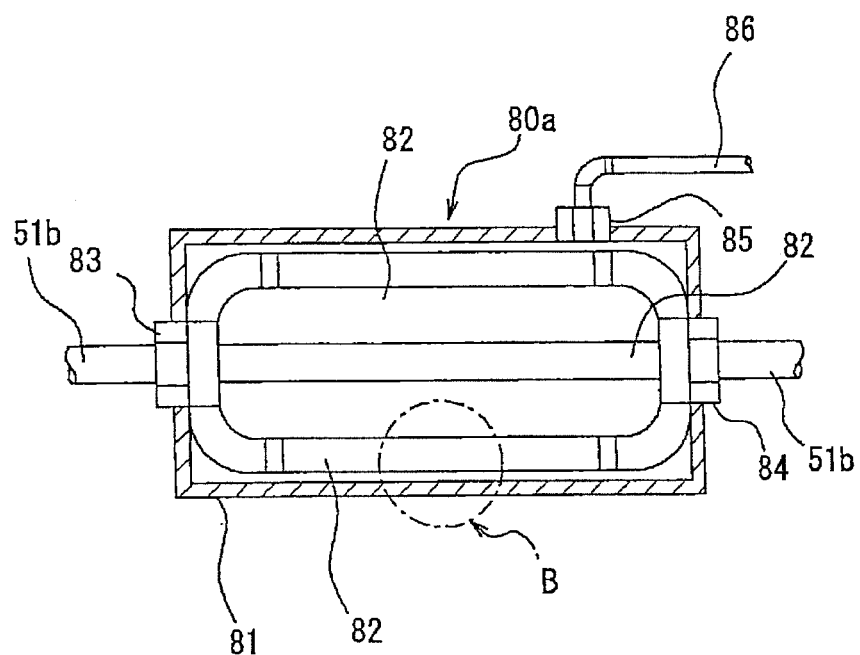
(b)
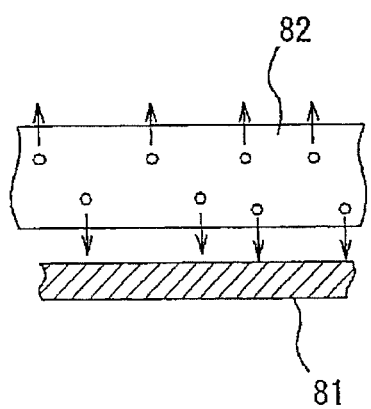

SOLUTION TREATMENT APPARATUS AND SOLUTION TREATMENT METHOD

This application is a divisional of U.S. patent application Ser. No. 14/378,337 filed on Aug. 13, 2014, which is a U.S. National Stage application of PCT/JP2013/054517 filed on Feb. 22, 2013 and is based upon and claims the benefit of priority of the prior Japanese Patent Application No. 2012-39538, filed in Japan on Feb. 27, 2012, and the prior Japanese Patent Application No. 2012-288515, filed in Japan Dec. 28, 2012, the entire contents of which are incorporated herein by reference.

TECHNICAL FIELD

This invention relates to a solution treatment apparatus and a solution treatment method of supplying a treatment solution to a surface of a substrate to be treated such as a semiconductor wafer, a glass substrate for LCD and so on.

BACKGROUND ART

Generally, in a photolithography technique of manufacturing a semiconductor device, a circuit pattern is formed in a resist film by applying a photoresist to a semiconductor wafer, an FPD substrate or the like (hereinafter, referred to as a wafer or the like), exposing a resist film formed by the application to light according to a predetermined circuit pattern, and developing the exposed pattern.

In the photolithography process, bubbles of a nitrogen gas or the like and particles (foreign matters) may mix into the treatment solution such as a resist solution, a developing solution and so on to be supplied to the wafer or the like due to various causes, and the treatment solution in which the bubbles and particles mix, if supplied to the wafer or the like, may cause coating unevenness and defects. Therefore, an apparatus for removing the bubbles and particles existing in the treatment solution is provided in a pipeline for the treatment solution.

Conventionally, a treatment solution supply apparatus having a temporary storage container, a filter, and a pump which are provided in a supply pipeline connecting a supply nozzle and a treatment solution storage container, and having a circulation pipeline connected to a supply pipeline between the treatment solution storage container and the temporary storage container and to a filter and having a variable throttle provided in the circulation pipeline is known as the aforementioned kind of apparatus (for example, refer to Patent Document 1). This treatment solution supply apparatus is provided with a plurality of supply nozzles for efficiency of the treatment performed in the photolithography process and for diversification, and selectively uses the supply nozzles depending on the purpose.

In this treatment solution supply apparatus, the liquid pressure of the treatment solution from which bubbles have been removed by the filter is decreased by the variable throttle to make the gas dissolved in the treatment solution into bubbles, and the bubbles are removed by passing through the filter again via the supply pipeline from the circulation path. Therefore, the gas dissolved in the treatment solution can be efficiently removed.

PRIOR ART DOCUMENT

Patent Document

[Patent Document 1] Japanese Patent Application Laid-open No. 2010-135535 (What Is Claimed, FIG. 3, FIG. 4)

DISCLOSURE OF THE INVENTION

Problems to be Solved by the Invention

Incidentally, in the treatment solution supply apparatus having a plurality of supply pipelines, stay of the treatment solution occurs in the filter provided in the supply pipeline connected to a supply nozzle not in use. Here, if the treatment solution is kept staying for a long time in a place with a large capacity such as a filter or the like, bubbled and gel staying, in particular, in the filter tend to grow and increase as particles at the interface between the filter and the treatment solution. Therefore, there is a conceivable method of periodically performing discharge of the treatment solution to a place other than the wafer or the like to thereby inhibit the treatment solution from staying for a long time in the place with a large capacity such as a filter or the like (a so-called dummy discharge) as a method of preventing the increase of particles mixed in the treatment solution. However, the discharged treatment solution in the dummy discharge is discarded, causing a problem of increasing the consumption of the treatment solution.

This invention has been made in consideration of the above circumstances, and its object is to efficiently suppress increase of particles in a treatment solution without wastefully consuming the treatment solution.

Means for Solving the Problems

To solve the above problem, a solution treatment apparatus of this embodiment is a solution treatment apparatus connected to one treatment solution supply nozzle of a plurality of treatment solution supply nozzles each of which supplies a treatment solution to a substrate to be treated, the solution treatment apparatus including:

a supply pipeline that connects a treatment solution storage container that stores the treatment solution and the one treatment solution supply nozzle;

a filter apparatus that is provided in the supply pipeline, and filtrates the treatment solution and removes foreign matters mixed in the treatment solution;

a pump that is provided in the supply pipeline on a secondary side of the filter apparatus;

a circulation pipeline that connects a discharge side of the pump and an intake side of the filter apparatus;

a supply control valve that is provided in the supply pipeline on a secondary side of the pump;

a circulation control valve that is provided in the circulation pipeline; and a control unit that controls the pump, the supply control valve, and the circulation control valve, wherein the control unit opens the circulation control valve and drives the pump when supply of the treatment solution from the one treatment solution supply nozzle to the substrate to be treated is stopped by closing the supply control valve, to thereby circulate the treatment solution between the supply pipeline having the filter apparatus and the circulation pipeline.

The above configuration makes it possible to make the treatment solution staying in the filter apparatus circulate through the supply pipeline and the circulation pipeline in a state in which the supply of the treatment solution from the one treatment solution supply nozzle to the substrate to be treated is stopped (a so-called idle state).

Note that the idle state in this invention includes a state soon after installation of the treatment solution storage container until start of supply of the treatment solution to the substrate to be treated as well as the state in which the supply of the treatment solution from the one treatment solution supply nozzle to the substrate to be treated is stopped.

Further, according to another aspect, the present invention is a solution treatment method using a solution treatment apparatus, the solution treatment apparatus including:

a supply pipeline that connects a treatment solution storage container that stores a treatment solution and a treatment solution supply nozzle that supplies the treatment solution to a substrate to be treated;

a filter apparatus that is provided in the supply pipeline, and filtrates the treatment solution and removes foreign matters mixed in the treatment solution;

a pump that is provided in the supply pipeline on a secondary side of the filter apparatus;

a circulation pipeline that connects a discharge side of the pump and an intake side of the filter apparatus;

a supply control valve that is provided in the supply pipeline on a secondary side of the pump;

a circulation control valve that is provided in the circulation pipeline; and a control unit that controls the pump, the supply control valve, and the circulation control valve.

The solution treatment method includes:

a treatment solution supply step of supplying the treatment solution to the substrate to be treated by opening the supply control valve and closing the circulation control valve and driving the pump; and a circulation step of circulating the treatment solution between the circulation pipeline and the supply pipeline by closing the supply control valve and opening the circulation control valve and driving the pump when the treatment solution supply step is not performed.

Use of the above method makes it possible to make the treatment solution circulate between the circulation pipeline and the supply pipeline when the supply of the treatment solution to the substrate to be treated is not performed, thereby making the treatment solution staying in the filter apparatus circulate through the supply pipeline and the circulation pipeline in the idle state.

Effect of the Invention

According to this invention, it is possible to make a treatment solution in a nonuse state staying in a filter apparatus circulate through a supply pipeline and a circulation pipeline and thereby to suppress increase of particles in the treatment solution without performing dummy discharge in use. Therefore, it is possible to efficiently prevent the increase of particles in the treatment solution without wastefully consuming the treatment solution.

BRIEF DESCRIPTION OF THE DRAWINGS

FIG. 11 An illustration of the whole degassing mechanism in the fifth embodiment of the solution treatment apparatus according to this invention, and (a) of FIG. 11 being a cross-sectional view and (b) of FIG. 11 being an enlarged cross-sectional view of a B part in FIG. 11(a).

BEST MODE FOR CARRYING OUT THE INVENTION

Figure 1:
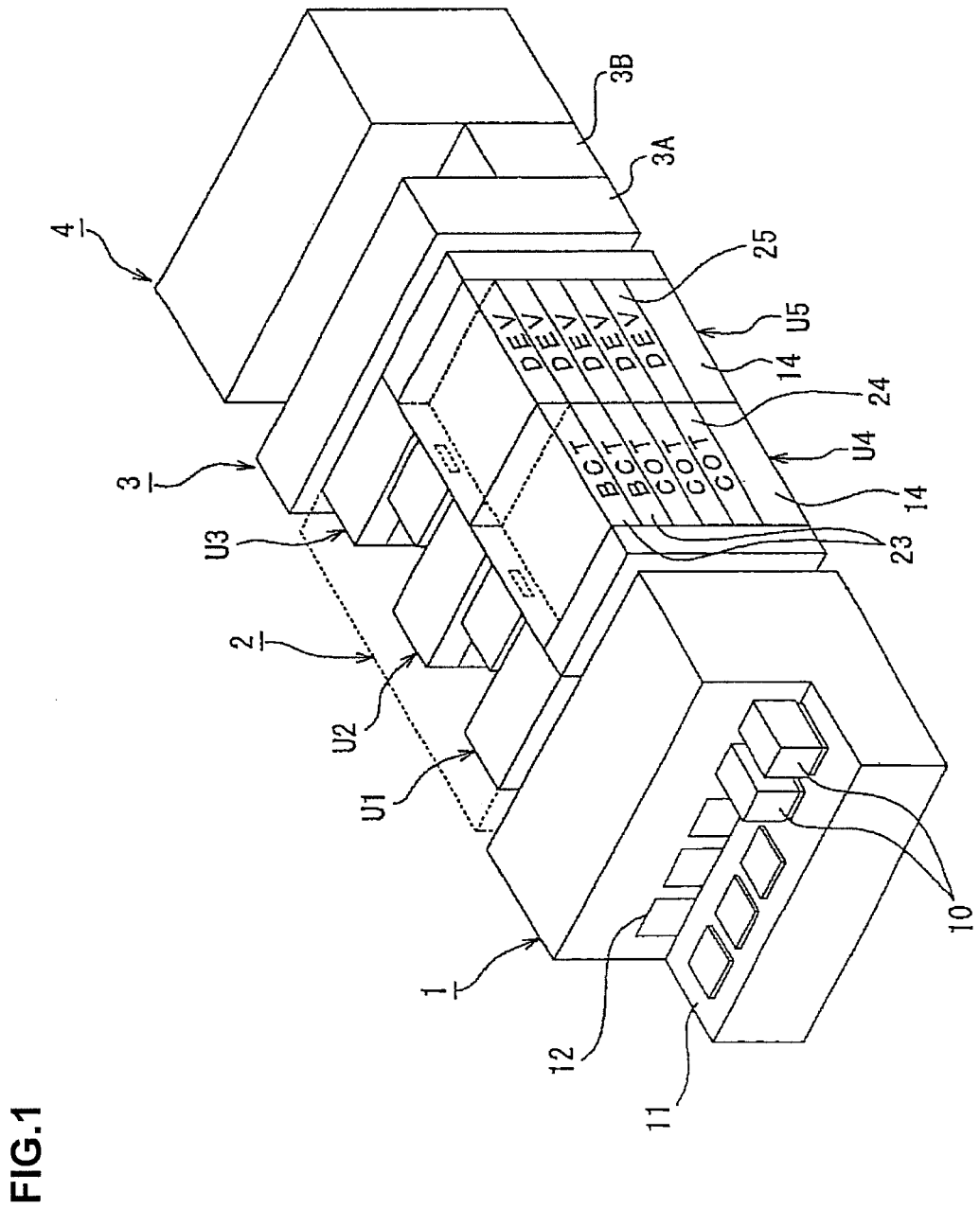
FIG. 1 A schematic perspective view illustrating the whole treatment system in which an exposure treatment apparatus is connected to a coating and developing treatment apparatus to which a solution treatment apparatus according to this invention is applied.

Hereinafter, embodiments of this invention will be described referring to the drawings. Here, a case where a resist solution treatment apparatus as a solution treatment apparatus according to this invention is installed in a coating and developing treatment apparatus will be described.

Figure 2:
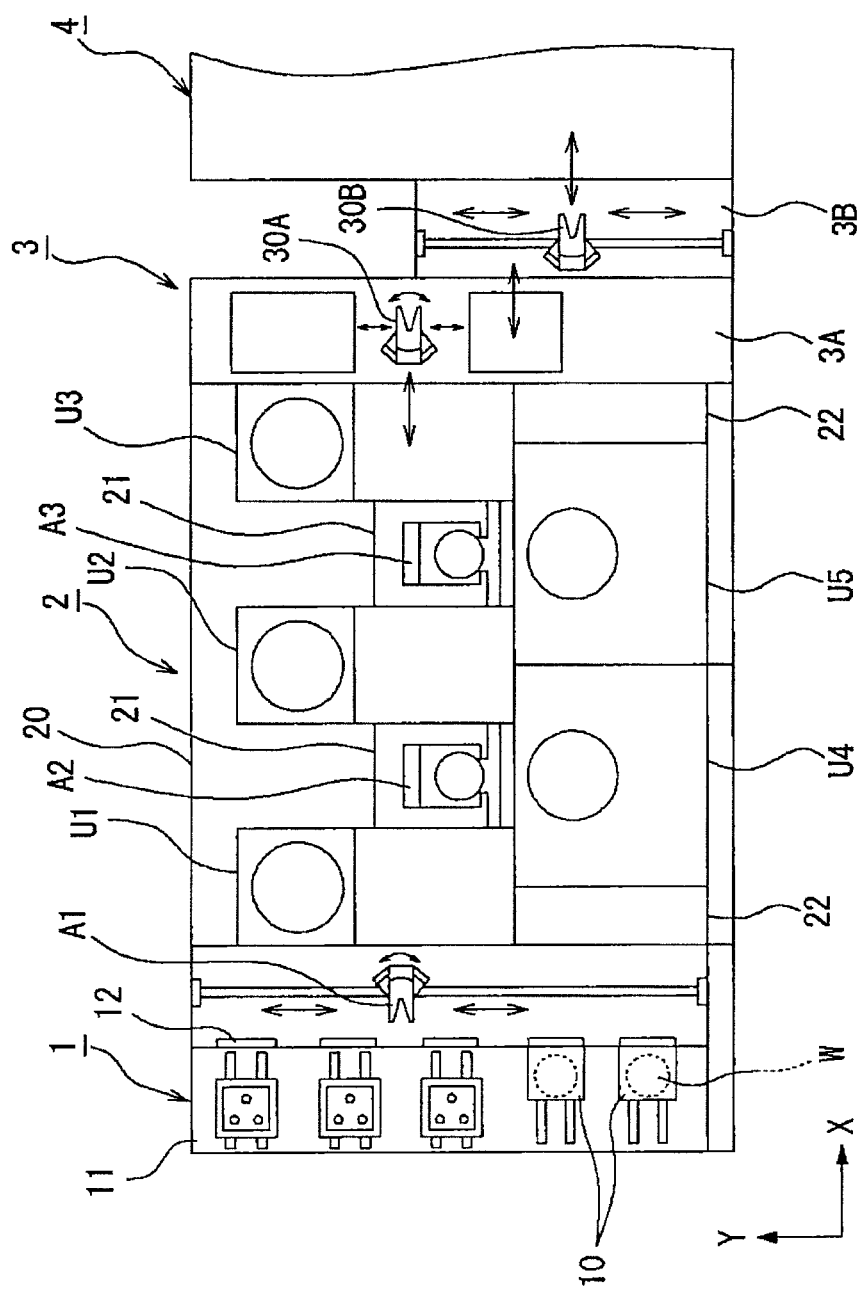
FIG. 2 A schematic plan view of the treatment system.

The coating and developing treatment apparatus includes, as illustrated in FIG. 1 and FIG. 2, a carrier station 1 to transfer in/out a carrier 10 that hermetically houses a plurality of, for example, 25 wafers W being substrates to be treated, a treatment section 2 that performs resist coating, developing treatment and the like on the wafer W taken out of the carrier station 1, an exposure section 4 that performs liquid-immersion exposure on the front surface of the wafer W with a liquid layer transmitting light formed on the front surface of the wafer W, and an interface section 3 that is connected between the treatment section 2 and the exposure section 4 and delivers the wafer W.

In the carrier station 1, a mounting part 11 capable of mounting a plurality of carriers 10 side by side thereon, opening/closing parts 12 provided in a front wall surface as seen from the mounting part 11, and a delivery means A1 to take the wafer W out of the carrier 10 via the opening/closing part 12 are provided.

The interface section 3 is composed of a first transfer chamber 3A and a second transfer chamber 3B which are provided one behind the other between the treatment section 2 and the exposure section 4 and provided with a first wafer transfer unit 30A and a second wafer transfer unit 30B respectively.

To the rear side of the carrier station 1, the treatment section 2 is connected which is surrounded at the periphery by a housing 20. In the treatment section 2, shelf units U1, U2, U3 in each of which units of heating and cooling systems are multi-tiered, solution treatment units U4, U5, and main transfer means A2, A3 that transfer the wafer W between the unit, are sequentially provided arranged alternately from the front side.

Further, each of the main transfer means A2, A3 is placed in a space surrounded by a partition wall 21 composed of face portions on the side of the shelf units U1, U2, U3 which are arranged in a forward and backward direction as viewed from the carrier station 1, one face portion on the side of, for example, the later-described solution treatment unit U4, U5 on the right side, and a rear face portion forming one face on the left side. Further, temperature and humidity regulating units 22 each including a temperature regulator for treatment solutions used in the units, a duct for regulating the temperature and humidity and so on are disposed respectively between the carrier station 1 and the treatment section 2 and between the treatment section 2 and the interface section 3.

The shelf units U1, U2, U3 are configured such that various kinds of units to perform pre-treatment and post-treatment of the treatments performed in the solution treatment units U4, U5 are multi-tiered, for example, ten-tiered, in which the combination of the units includes a heating unit (not illustrated) that heats (so-called baking treatment) the wafer W, a cooling unit (not illustrated) that cools the wafer W, and so on. Further, the solution treatment units U4, U5 that supply predetermined treatment solutions to the wafer W to perform treatments are configured such that anti-reflection film coating units (BCT) 23 each of which applies an anti-reflection film, coating units (COT) 24 each of which applies a resist solution on the wafer W, developing units (DEV) 25 each of which supplies a developing solution to the wafer W to perform developing treatment and so on are multi-tiered, for example, five-tiered on chemical storage units 14 for the resist, the developing solution and so on, for example, as illustrated in FIG. 1. The coating unit (COT) 24 includes a solution treatment apparatus 5 and a solution treatment unit 100 according to this invention.

An example of the flow of the wafer in the coating and developing treatment apparatus configured as described above will be briefly described referring to FIG. 1 and FIG. 2. First, when the carrier 10 housing, for example, 25 wafers W is mounted on the mounting part 11, a lid body of the carrier 10 is removed together with the opening/closing part 12, and a wafer W is taken out by the delivery means A1. The wafer W is then delivered via a delivery unit (not illustrated) forming one tier in the shelf unit U1 to the main transfer means A2, subjected, for example, to anti-reflection film forming treatment and cooling treatment as the pre-treatment of the coating treatment, and then coated with a resist solution in the coating unit (COT) 24. Subsequently, by the main transfer means A2, the wafer W is heated (baking treatment) in the heating unit forming one tier in one of the shelf units U1, U2 and cooled, and then carried via the delivery unit in the shelf unit U3 into the interface section 3. In the interface section 3, the wafer W is transferred by the first wafer transfer unit 30A and the second wafer transfer unit 30B in the first transfer chamber 3A and the second transfer chamber 3B to the exposure section 4, and subjected to exposure by an exposure means (not illustrated) disposed to face the front surface of the wafer W. After the exposure, the wafer W is transferred in a reverse route to the main transfer means A3 and developed in the developing unit (DEV) 25, whereby a pattern is formed on the wafer W. Thereafter, the wafer W is returned to the original carrier 10 mounted on the mounting part 11.

Next, a first embodiment of the solution treatment apparatus according to this invention will be described.

First Embodiment

Figure 3:
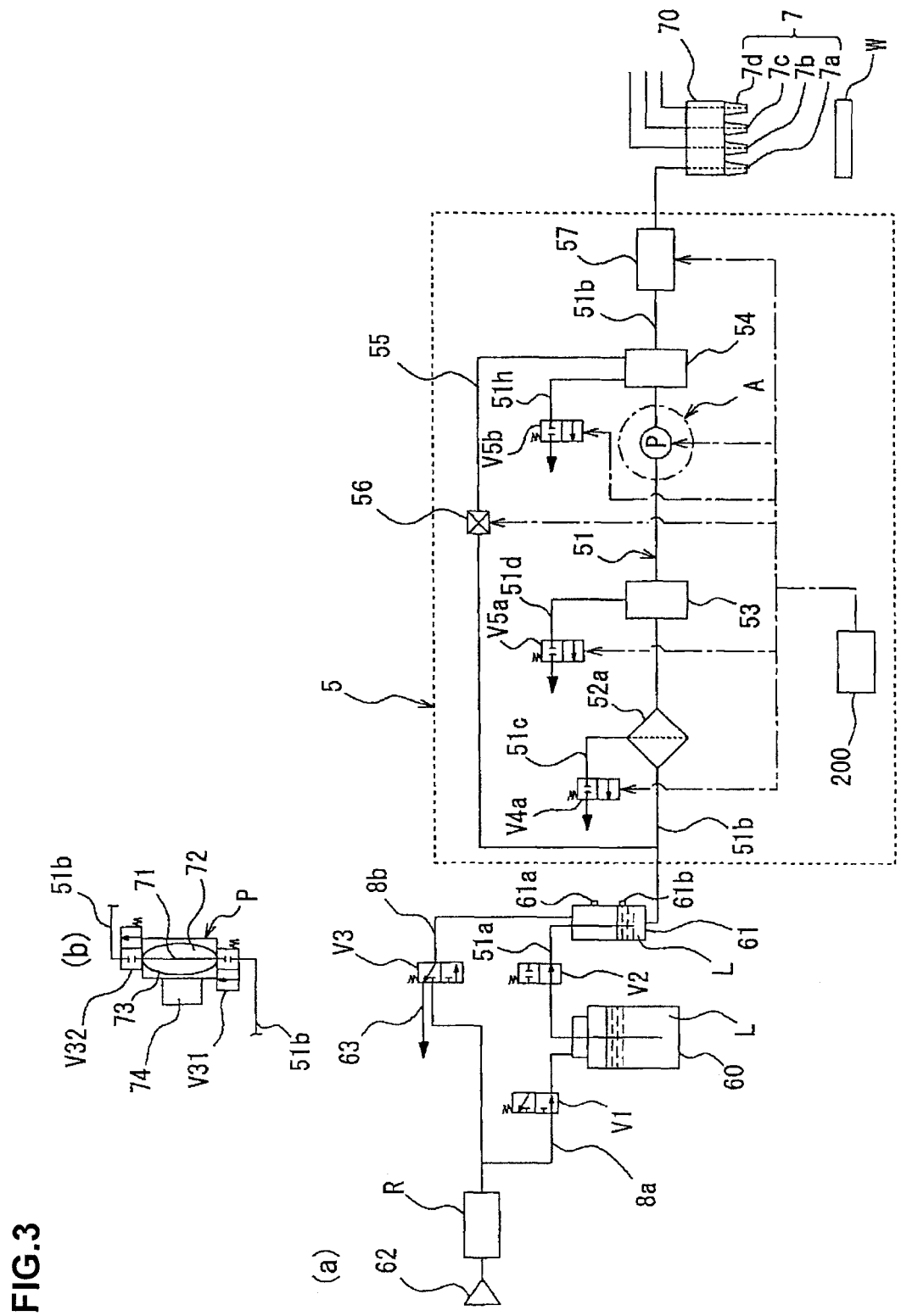
FIG. 3 An illustration of a schematic configuration of a first embodiment of the solution treatment apparatus according to this invention, and (a) of FIG. 3 being a schematic cross-sectional view and (b) of FIG. 3 being a schematic cross-sectional view of an A part in FIG. 3(a).

The solution treatment apparatus 5 according to this invention includes, as illustrated in FIG. 3: a supply pipeline 51 that connects a treatment solution storage container 60 (hereinafter, referred to as a resist container 60) that stores a resist solution L being a treatment solution and one treatment solution supply nozzle 7a of later-described treatment solution supply nozzle 7, which discharges and supplies the resist solution L to the wafer W; a filter apparatus 52a that is provided in the supply pipeline 51 and filtrates the resist solution L to remove particles and remove foreign matters (bubbles) mixed in the resist solution L; a first trap tank 53 that is provided in the supply pipeline 51 on the secondary side of the filter apparatus 52a; a pump P that is provided in the supply pipeline 51 on the secondary side of the first trap tank 53; a second trap tank 54 that is provided in the supply pipeline 51 on the secondary side of the pump P; a circulation pipeline 55 that connects the discharge side of the pump P and the intake side of the filter apparatus 52a; a circulation control valve 56 that is provided in the circulation pipeline 55; and a supply control valve 57 that is provided in the supply pipeline 51 on the secondary side of the second trap tank 54.

The supply pipeline 51 is composed of a first treatment solution supply pipeline 51a that connects the resist container 60 and a buffer tank 61 as a treatment solution temporary storage container that temporarily stores the treatment solution led from the resist container 60, and a second treatment solution supply pipeline 51b that connects the buffer tank 61 and the treatment solution supply nozzle 7. Accordingly, the filter apparatus 52a, the first trap tank 53, the pump P, the second trap tank 54, and the supply control valve 57 are provided in the second treatment solution supply pipeline 51b.

The circulation pipeline 55 connects the second treatment solution supply pipeline 51b on the secondary side of the pump P and the second treatment solution supply pipeline 51b on the primary side of the filter apparatus 52a via the second trap tank 54. Note that the second trap tank 54 is provided at a connection portion connecting the supply pipeline 51 and the circulation pipeline 55.

As illustrated in FIG. 3(b), as the pump P, a diaphragm pump is used which sucks and discharges the treatment solution in the second treatment solution supply pipeline 51b. The pump P is partitioned into a pump chamber 72 corresponding to a pump portion and an operating chamber 73 corresponding to a driving portion by a diaphragm 71 being a flexible member. Further, an electromagnetic opening/closing valve V31 that enables inflow of the resist solution L from the second treatment solution supply pipeline 51b into the pump P is provided at an intake port of the pump P, and an electromagnetic opening/closing valve V32 is provided at a discharge port. The opening/closing valves V31, V32 communicate with the pump chamber 72.

To the operating chamber 73, a driving means 74 is connected which includes an electropneumatic regulator that controls depressurization and pressurization of the gas in the operating chamber 73 on the basis of a signal from a controller 200. The opening/closing valves V31, V32 are controlled based on the signals from the controller 200. The controller 200 is mainly composed of a central processing unit (CPU) as a later-described control unit.

Further, to the second treatment solution supply pipeline 51b on the secondary side of the supply control valve 57, the treatment solution supply nozzle 7 provided in a nozzle unit 70 is connected. As the supply control valve 57, for example, a flow rate control valve including a dispense valve is used.

The nozzle unit 70 is provided with a plurality of (a case of four is illustrated in the drawing) treatment solution supply nozzles 7a to 7d, and the treatment solution supply nozzle 7a among them is connected to the solution treatment apparatus 5 in this embodiment. Further, to the other treatment solution supply nozzles 7b to 7d, resist containers, filter apparatuses, and pumps which are similar to the above-described resist container 60, filter apparatus 52a, and pump P are connected.

At the top of the resist container 60, a first gas supply pipeline 8a is provided which connects with a nitrogen gas supply source 62 that supplies an inert gas, for example, a nitrogen gas ($N_2$). Further, the first gas supply pipeline 8a is provided with an electropneumatic regulator R being a pressure regulating means capable of variable regulation. The electropneumatic regulator R includes an operation part that operates by a control signal from the controller 200, for example, a proportional solenoid, and a valve mechanism that opens/closes by the operation of the proportional solenoid, and is configured to regulate the pressure by opening/closing the valve mechanism.

Between the electropneumatic regulator R of the first gas supply pipeline 8a and the resist container 60, an electromagnetic switching valve V1 is provided. Further, between the resist container 60 and the buffer tank 61 in the first treatment solution supply pipeline 51a, an electromagnetic opening/closing valve V2 is provided.

Further, a second gas supply pipeline 8b having one end branching off from the first gas supply pipeline 8a and another end connected to the top of the buffer tank 61, is connected to the first gas supply pipeline 8a. The second gas supply pipeline 8b is provided with a switching valve V3 that communicates with the inside of the buffer tank 61 and switchably with an atmosphere part 63 open to the atmosphere or the nitrogen gas supply source 62. The switching valve V3 is constituted of an electromagnetic switching valve that is capable of switching the position to three ports to switch to one port on the buffer tank 61 side and two ports on the nitrogen gas supply source 62 side and the atmosphere part 63 side, and is formed so that the inside of the buffer tank 61 is communicable with the atmosphere side or the nitrogen gas supply source 62 side by the switching operation of the switching valve V3.

On the other hand, at the top of the filter apparatus 52a, a drain pipe 51c for discharging the atmosphere in the filter apparatus 52a is provided, and the drain pipe 51c is provided with an electromagnetic opening/closing valve V4a. Further, at the tops of the first trap tank 53 and the second trap tank 54, drain pipes 51d, 51h for discharging the atmospheres in the first trap tank 53 and the second trap tank 54 are provided, and the drain pipes 51d, 51h are provided with electromagnetic opening/closing valves V5a, V5b.

The opening/closing valves V4, V5a, V5b, the circulation control valve 56, and the supply control valve 57 are electrically connected to the controller 200, and perform switching operations and opening/closing operations on the basis of the control signals from the controller 200. Note that the buffer tank 61 is provided with an upper limit liquid level sensor 61a and a lower limit liquid level sensor 61b that detect an upper limit liquid level and a lower limit liquid level of the resist solution L in the buffer tank 61. Signals detected by the upper limit liquid level sensor 61a and the lower limit liquid level sensor 61b are transmitted to the controller 200. Further, the electropneumatic regulator R, the switching valve V1, the opening/closing valve V2, and the switching valve V3 are electrically connected to the controller 200 and operate based on the control signals from the controller 200. Note that the connections between the electropneumatic regulator R, the upper limit liquid level sensor 61a, the lower limit liquid level sensor 61b, the switching valves V1, V3, the opening/closing valves V2, V4a to V7, the opening/closing valves V31 to V33, the circulation control valve 56 and the supply control valve 57, and, the controller 200 are not illustrated in FIG. 4 to FIG. 17.

Figure 4:
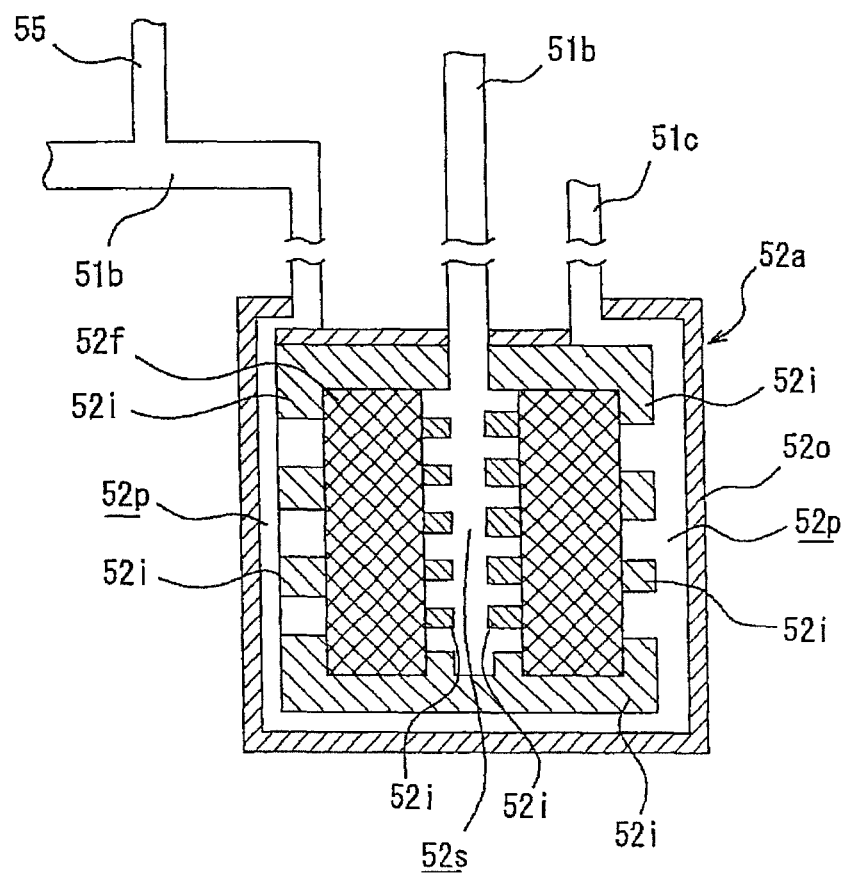
FIG. 4 An enlarged schematic cross-sectional view illustrating of a part near a filter apparatus in the first embodiment of the solution treatment apparatus according to this invention.

Next, the configuration of the filter apparatus 52a of the above-described solution treatment apparatus will be described based on FIG. 4. The filter apparatus 52a is mainly composed of a filter 52f formed in a cylindrical shape, a holding part 52i that holds the filter 52f to surround it, and an outer wall part 52o. Further, on the inner peripheral side of the filter 52f, a space part 52s is provided in which the circulating resist solution L is filled. Between the outer wall part 52o and the holding part 52i of the filter apparatus 52a, a resist solution passage 52p is provided. Further, the secondary side of the resist solution passage 52p communicates with the space part 52s via the filter 52f. Further, the primary side and the secondary side of the space part 52s communicate with the second treatment solution supply pipeline 51b, and the secondary side of the resist solution passage 52p communicates with the drain pipe 51c.

Next, the operation aspect of the solution treatment apparatus will be described referring to FIG. 3(a) to FIG. 6. Note that the control system such as the controller 200 and so on are omitted in FIG. 5 and FIG. 6.

Supply of Resist Solution to Buffer Tank

First, the resist container 60 is set (installed), then the switching valve V1 provided in the first gas supply pipeline 8a and the opening/closing valve V2 provided in the first treatment solution supply pipeline 51a are opened based on the control signals from the controller 200, to supply the resist solution L into the buffer tank 61 by pressurization of the nitrogen gas supplied from the nitrogen gas supply source 62 into the resist container 60. In this event, the switching valve V3 has been switched to the atmosphere part 63 side so that the inside of the buffer tank 61 communicates with the atmosphere.

Nitrogen Gas Pressurization to Resist Solution—Discharge of Resist Solution

Figure 5:
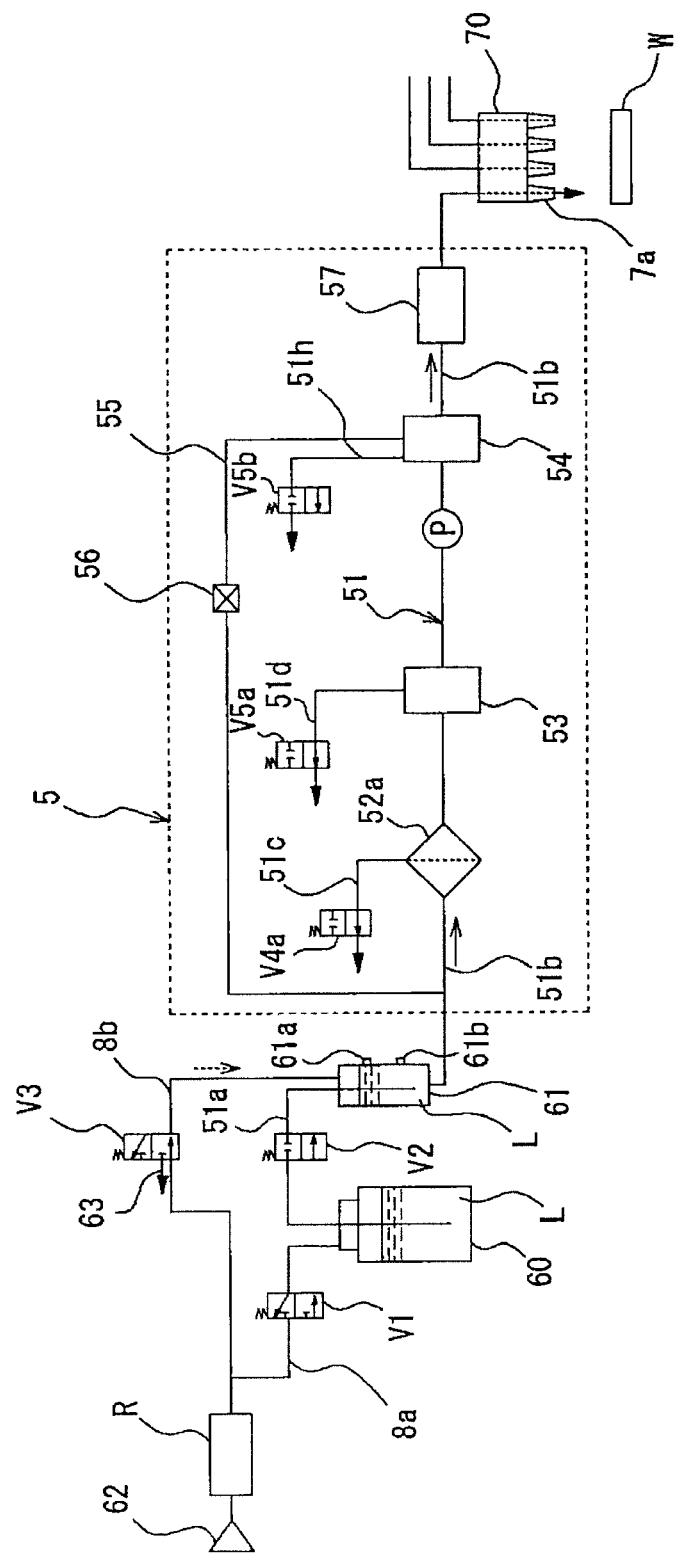
FIG. 5 A schematic cross-sectional view illustrating a normal treatment operation in the solution treatment apparatus.

As illustrated in FIG. 5, when the inside of the buffer tank 61 is replenished with a predetermined amount of the resist solution L, the switching valve V1 and the opening/closing valve V2 are closed and the switching valve V3 is switched to the nitrogen gas supply source 62 side, based on the control signals from the not-illustrated controller which has received the detection signal from the upper limit liquid level sensor 61a. Thus, the nitrogen gas is supplied from the nitrogen gas supply source 62 into the buffer tank 61, while the supply control valve 57 in the second treatment solution supply pipeline 51b is opened and the pump P is driven, thereby discharging (supplying) the resist solution L from the treatment solution supply nozzle 7a to the wafer W and performing treatment (treatment solution supply step). In this event, the opening/closing valves V4a, V5a, V5b have been opened by the signals from the not-illustrated controller, and bubbles dissolved in the filter apparatus 52a, the first trap tank 53 and the second trap tank 54 are discharged to the outside via the drain pipes 51c, 51d, 51h.

Circulation of Resist Solution

Figure 6:
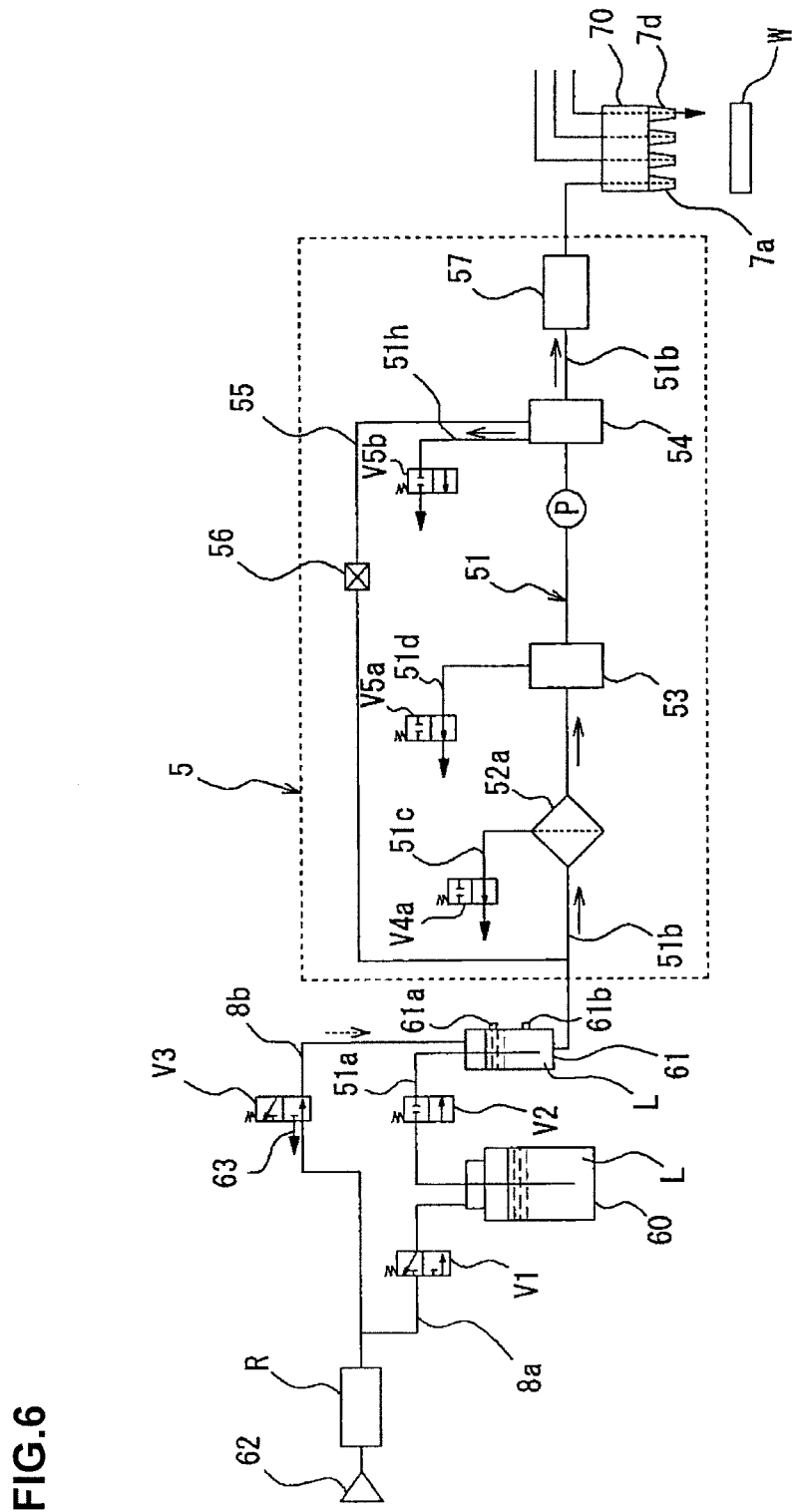
FIG. 6 A schematic cross-sectional view illustrating a circulation treatment operation in the solution treatment apparatus.

Next, the circulation of the resist solution L performed through the supply pipeline 51 and the circulation pipeline 55 will be described. When the resist solution is supplied from the treatment solution supply nozzle 7d to the wafer W as illustrated in FIG. 6, the supply control valve 57 is closed by the signal from the not-illustrated controller to stop the supply of the resist solution L from the treatment solution supply nozzle 7a to the wafer W (idle state). In this idle state, the circulation control valve 56 is opened by the signal from the not-illustrated controller.

When the pump P is driven with the supply control valve 57 provided in the second treatment solution supply pipeline 51b closed and the circulation control valve 56 provided in the circulation pipeline 55 opened, the resist solution L staying in the filter apparatus 52a flows into the circulation pipeline 55 via the first trap tank 53 and the second trap tank 54. The resist solution L flowed into the circulation pipeline 55 flows into the second treatment solution supply pipeline 51b on the primary side of the filter apparatus 52a. Accordingly, when supplying the treatment solution from the treatment solution supply nozzle 7d to the wafer W, the supply control valve 57 is closed, the circulation control valve 56 is opened, and the pump P is driven, whereby the resist solution L is circulated between the second treatment solution supply pipeline 51b and the circulation pipeline 55 (circulation step). Then, after the circulation step is completed, the treatment solution supply step is performed.

The above configuration makes it possible, in the state that the resist is supplied from the treatment solution supply nozzle 7d to the wafer W and the supply of the resist solution L from the treatment solution supply nozzle 7a to the wafer W is stopped (idle state), to circulate the resist solution L staying in the filter apparatus 52a through the second treatment solution supply pipeline 51b and the circulation pipeline 55. Accordingly, even in the idle state where the supply of the resist solution L from the treatment solution supply nozzle 7a to the wafer W is stopped, it is possible to suppress the increase of particles in the resist solution L without performing dummy discharge when supplying the treatment solution. Accordingly, it is possible to efficiently suppress the increase of particles in the resist solution L without wastefully consuming the resist solution L.

Note that even in the case where the time period of the idle state after the resist container 60 is installed until the treatment solution supply step is started is long, it is preferable to perform the circulation step before start of the treatment solution supply step. Performing the circulation step before the treatment solution supply step as described above makes it possible to suppress the increase of particles in the resist solution L before start of the treatment solution supply step, thereby efficiently suppressing the increase of particles in the resist solution L without wastefully consuming the resist solution L.

Here, it is preferable to perform the circulation of the resist solution L between the second treatment solution supply pipeline 51b and the circulation pipeline 55 at an interval of about 15 minutes. By performing the circulation of the resist solution L at a predetermined interval, stay of the resist solution L in the filter apparatus 52a can be suppressed at all times, so that when the resist solution L is discharged (supplied) from the treatment solution supply nozzle 7a to the wafer W after the idle state ends, the resist solution L can be supplied to the wafer W without performing circulation of the resist solution L by the solution treatment apparatus 5. Therefore, the time required for the step of supplying the resist solution L to the wafer W can be reduced.

Second Embodiment

Figure 7:
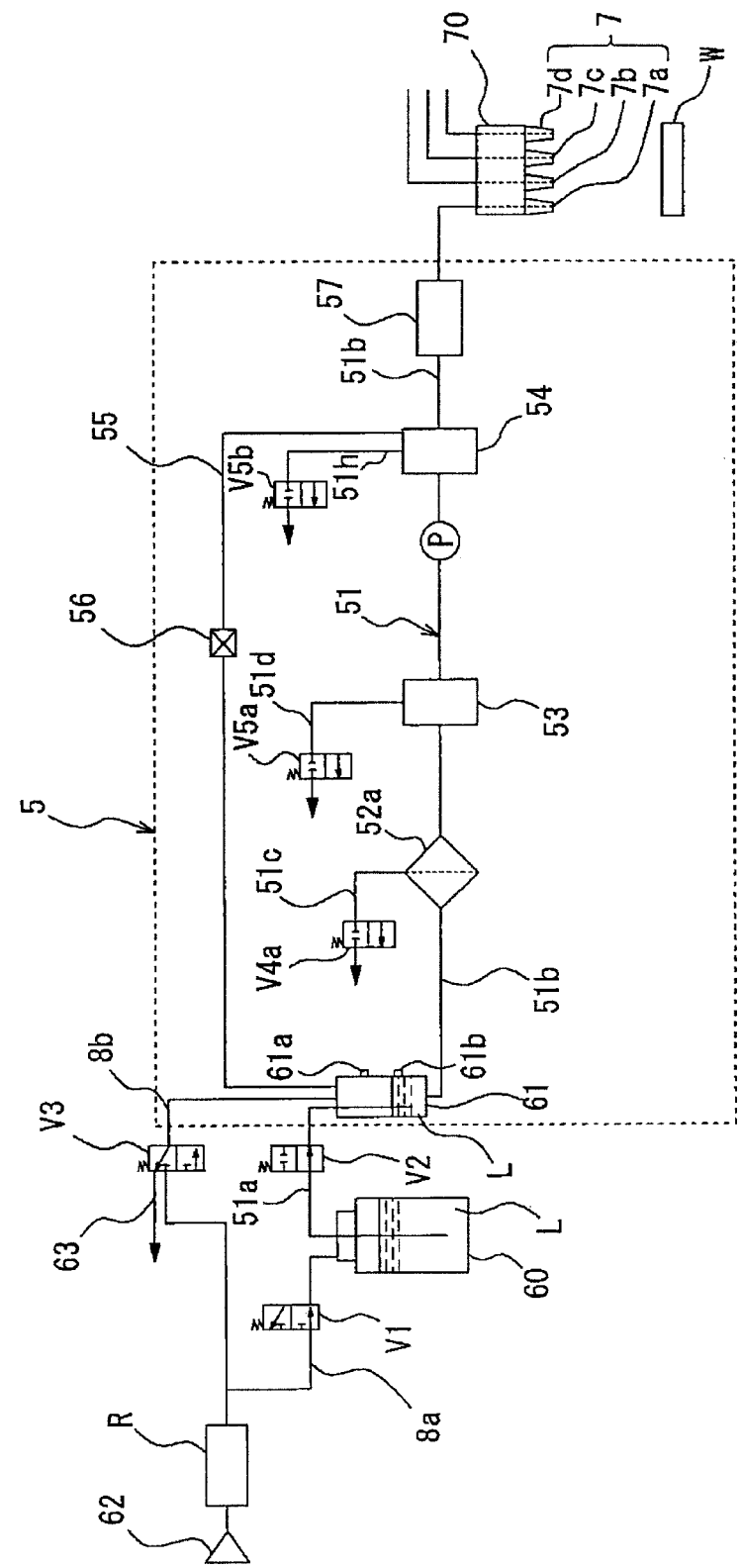
FIG. 7 A schematic cross-sectional view illustrating a second embodiment of the solution treatment apparatus according to this invention.
Figure 8:
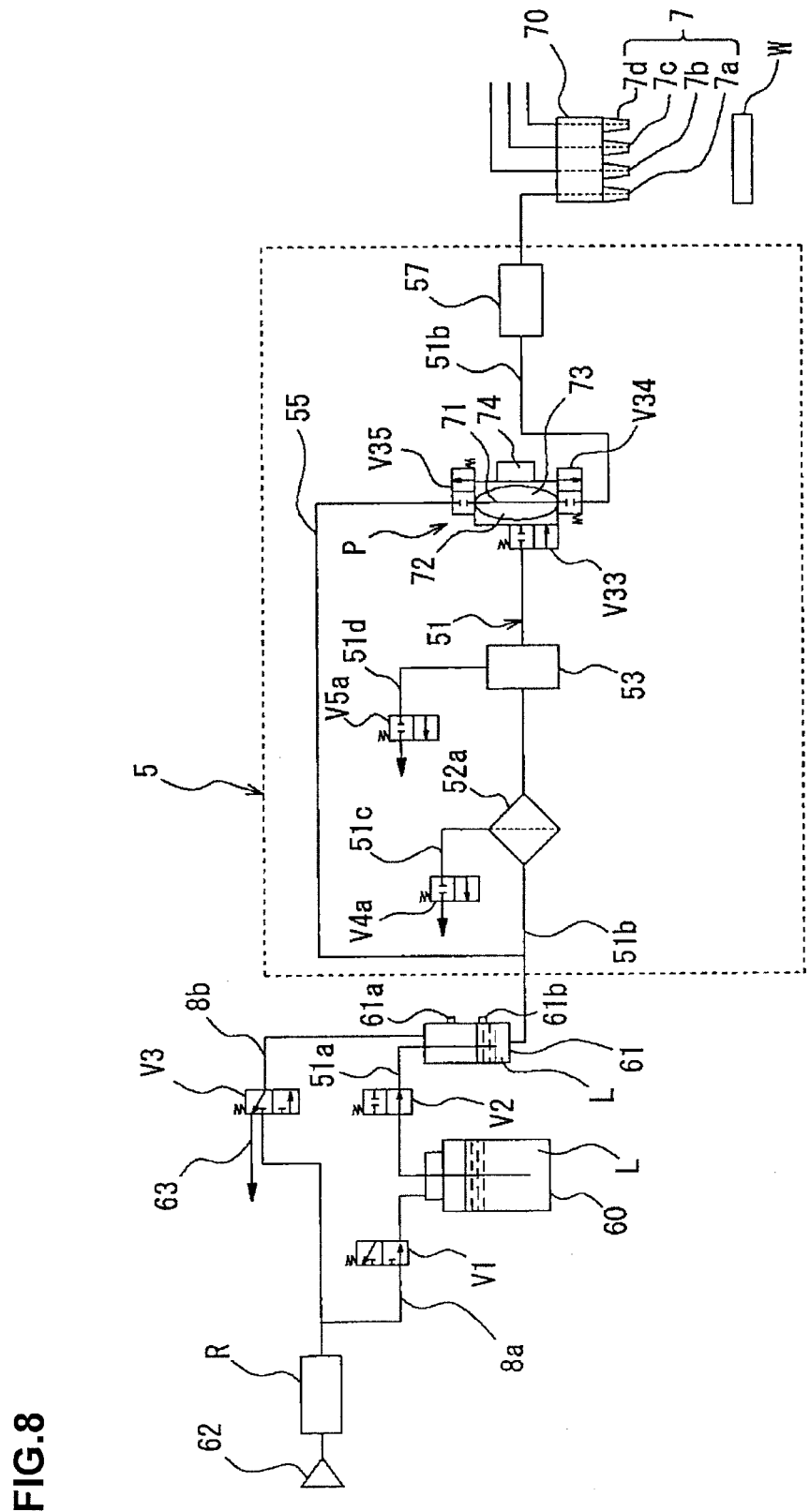
FIG. 8 A schematic cross-sectional view illustrating a third embodiment of the solution treatment apparatus according to this invention.

A second embodiment of the solution treatment apparatus according to this invention will be described based on FIG. 7. Note that the same reference numerals are given to the same components as those in the first embodiment to omit description thereof in the second embodiment.

A circulation pipeline 55 in the second embodiment connects a second treatment solution supply pipeline 51b on the secondary side of a pump P and a buffer tank 61 via a second trap tank 54. Accordingly, by driving the pump P with a supply control valve 57 and a switching valve V1 closed and a circulation control valve 56 opened, a resist solution L sucked in the pump P is supplied to the buffer tank 61 via the circulation pipeline 55. Note that the circulation pipeline 55 may connect a discharge port of the pump and the buffer tank 61.

The above configuration makes it possible, even in the idle state, to suppress the increase of particles in the resist solution L without performing dummy discharge when supplying the treatment solution as in the first embodiment. Accordingly, it is possible to efficiently suppress the increase of particles in the resist solution L without wastefully consuming the resist solution L. Further, when the resist solution L is discharged (supplied) from the treatment solution supply nozzle 7a to the wafer W after the idle state ends, the resist solution L can be supplied to the wafer W without performing circulation of the resist solution L by the solution treatment apparatus 5 as in the first embodiment. Therefore, the time required for the step of supplying the resist solution L to the wafer W can be reduced.

Third Embodiment

A third embodiment of the solution treatment apparatus according to this invention will be described based on FIG.

8. Note that the same reference numerals are given to the same components as those in the first embodiment to omit description thereof in the third embodiment.

A pump P used in the third embodiment has an intake port for sucking the treatment solution in a second treatment solution supply pipeline 51b on its primary side formed at one place, and discharge ports for discharging the treatment solution into the second treatment solution supply pipeline 51b on its secondary side and into a circulation pipeline 55 formed at two places. An electromagnetic opening/closing valve V33 (opening/closing valve V33 on the intake side) that operates based on a signal from a controller 200 to enable inflow of the resist solution L from the second treatment solution supply pipeline 51b on the primary side into the pump P is provided at the intake port. Further, an electromagnetic opening/closing valve V34 (first opening/closing valve V34) that operates based on a signal from the controller 200 to enable discharge of the resist solution L from the pump P to a treatment solution supply nozzle 7a and an electromagnetic opening/closing valve V35 (second opening/closing valve V35) that operates based on a signal from a controller 200 to selectively enable supply of the resist solution L to a circulation pipeline 55 of the pump P and discharge of gas in the pump P are provided at the discharge ports. The opening/closing valve V33 on the intake side, the first opening/closing valve V34, and the second opening/closing valve V35 communicate with a pump chamber 72.

To an operating chamber 73, a driving means 74 is connected which includes an electropneumatic regulator that controls depressurization and pressurization of the gas in the operating chamber 73 on the basis of a signal from the controller 200. The opening/closing valve V33 on the intake side, the first opening/closing valve V34, and the second opening/closing valve V35 are controlled based on the signals from the controller 200.

The circulation pipeline 55 is provided with the circulation control valve 56 in the first embodiment and the second embodiment, but the circulation pipeline 55 is not provided with the circulation control valve 56 in the third embodiment. Further, the second trap tank 54 is provided in the second treatment solution supply pipeline 51b on the secondary side of the pump P in the first embodiment and the second embodiment, but the second trap tank is not provided in the third embodiment. Further, in the third embodiment, the circulation pipeline 55 connects the discharge port of the pump P communicating therewith via the second opening/closing valve V35 and the second treatment solution supply pipeline 51b on the primary side of a filter apparatus 52a.

Next, the circulation of the resist solution L in the third embodiment will be described. In the idle state, the first opening/closing valve V34 and the supply control valve 57 have been closed and the opening/closing valve V33 on the intake side and the second opening/closing valve V35 have been opened by the control signals from the controller 200. When the pump P is driven in this state, the resist solution L staying in the filter apparatus 52a flows into the circulation pipeline 55 via the first trap tank 53, and the resist solution L flowed into the circulation pipeline 55 flows into the second treatment solution supply pipeline 51b on the primary side of the filter apparatus 52a.

The above configuration makes it possible, even in the idle states, to suppress the increase of particles in the resist solution L without performing dummy discharge when supplying the treatment solution as in the first embodiment. Accordingly, it is possible to efficiently suppress the increase of particles in the resist solution L without wastefully consuming the resist solution L. Further, when the resist solution L is discharged (supplied) from the treatment solution supply nozzle 7a to the wafer W after the idle state ends, the resist solution L can be supplied to the wafer W without performing circulation of the resist solution L by the solution treatment apparatus 5 as in the first embodiment. Therefore, the time required for the step of supplying the resist solution L to the wafer W can be reduced.

Fourth Embodiment

Figure 9:
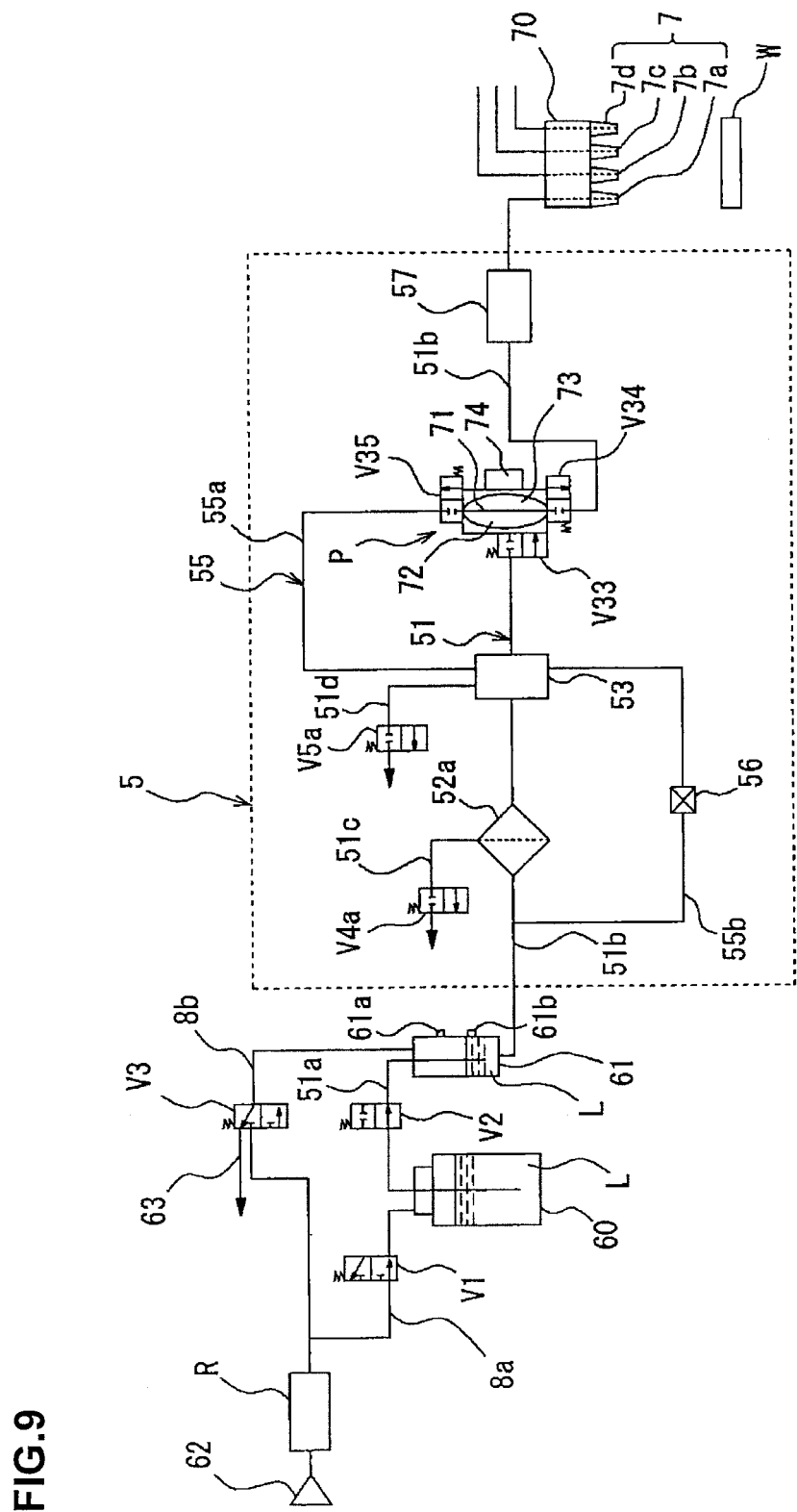
FIG. 9 A schematic cross-sectional view illustrating a fourth embodiment of the solution treatment apparatus according to this invention.

A fourth embodiment of the solution treatment apparatus according to this invention will be described based on FIG. 9. Note that the same reference numerals are given to the same components as those in the third embodiment to omit description thereof in the fourth embodiment.

A circulation pipeline 55 in the fourth embodiment is composed of a first circulation pipeline 55a that connects a first trap tank 53 and a pump P, and a second circulation pipeline 55b that connects the first trap tank 53 and a second treatment solution supply pipeline 51b on the primary side of a filter apparatus 52a. Further, the second circulation pipeline 55b is provided with a circulation control valve 56 that operates based on a signal from a controller 200 to enable circulation from the pump P to the filter apparatus 52a.

Next, circulation of the resist solution L in the fourth embodiment will be described. In the idle state, a first opening/closing valve V34 and a supply control valve 57 have been closed and an opening/closing valve V33 on an intake side and a second opening/closing valve V35 have been opened based on the signals from the controller 200. When the pump P is driven in this state, the resist solution L staying in the filter apparatus 52a flows into the first circulation pipeline 55a via the first trap tank 53 and the pump P, and the resist solution L flowed into the first circulation pipeline 55a flows into the second treatment solution supply pipeline 51b on the primary side of the filter apparatus 52a via the first trap tank 53 and the second circulation pipeline 55b.

The above configuration makes it possible, even in the idle state, to suppress the increase of particles in the resist solution L without performing dummy discharge when supplying the treatment solution, as in the third embodiment. Accordingly, it is possible to efficiently suppress the increase of particles in the resist solution L without wastefully consuming the resist solution L. Further, when the resist solution L is discharged (supplied) from a treatment solution supply nozzle 7a to the wafer W after the idle state ends, the resist solution L can be supplied to the wafer W without performing circulation of the resist solution L by the solution treatment apparatus 5 as in the third embodiment. Therefore, the time required for the step of supplying the resist solution L to the wafer W can be reduced.

Fifth Embodiment

Figure 10:
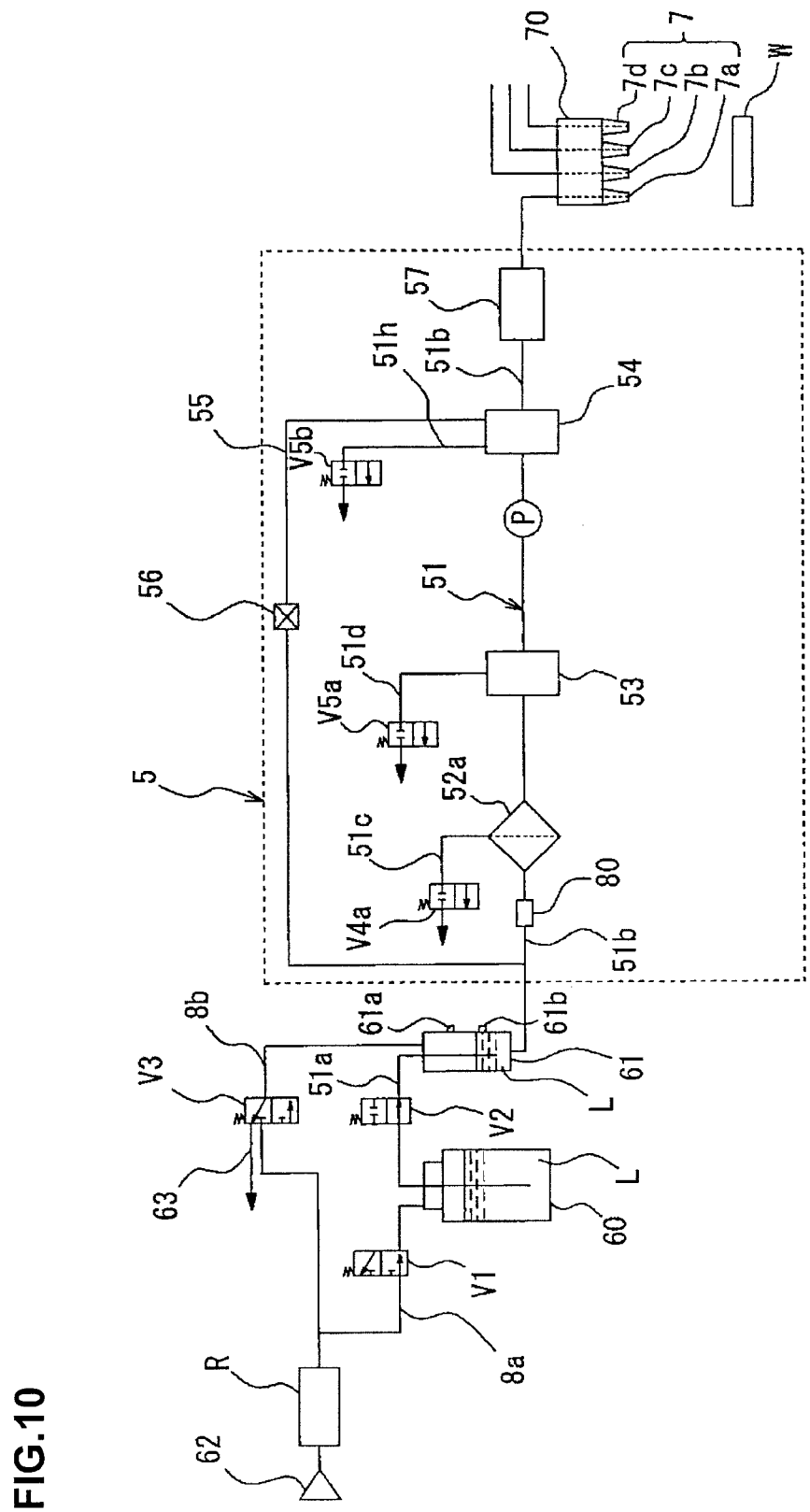
FIG. 10 A schematic cross-sectional view illustrating a fifth embodiment of the solution treatment apparatus according to this invention.

A fifth embodiment of the solution treatment apparatus according to this invention will be described based on FIG. 10, FIG. 11(a), FIG. 11(b). Note that the same reference numerals are given to the same components as those in the first embodiment to omit description thereof in the fifth embodiment.

A solution treatment apparatus 5 in the fifth embodiment has a degassing mechanism 80 provided in a second treatment solution supply pipeline 51b on a secondary side of a connection point between a circulation pipeline 55 and the second treatment solution supply pipeline 51b and on a primary side of a filter apparatus 52a.

The degassing mechanism 80 has a container 81 and a semipermeable membrane tube 82 and is configured to remove gas existing in the resist solution L as illustrated in FIG. 11(a), (b). Further, the container 81 has an inflow port 83 and an outflow port 84 that are connected to the second treatment solution supply pipeline 51b. The container 81 further has an exhaust port 85 to which a discharge pipe 86 for discharging the gas existing in the resist solution L to the outside is connected. Note that the discharge pipe 86 is connected to a not-illustrated exhaust pump.

On the other hand, the semipermeable membrane tube 82 is arranged in the container 81 and connected to both the ports 83, 84. The whole semipermeable membrane tube 82 is formed of an ethylene tetrafluoride-based or polyplefin-based hollow fiber membrane. Therefore, at driving a pump P, the resist solution L is made to flow into the semipermeable membrane tube 82 and the not-illustrated exhaust pump is driven to discharge air around the semipermeable membrane tube 82 in the container 81, thereby making it possible to reduce the pressure of the air around the semipermeable membrane tube 82 so as to expose the gas in the resist solution L. The exposed gas is discharged to the outside via the discharge pipe 86 by driving the exhaust pump.

The above configuration makes it possible to discharge the gas dissolved in the resist solution L to the outside by the degassing mechanism 80, so that the resist solution L circulating in a supply pipeline 51 or the circulation pipeline 55 can be degassed (degassing step). Therefore, it is possible to suppress mixture of gas into the resist solution L to be supplied to the wafer W.

Further, the above configuration makes it possible, even in the idle state, to suppress the increase of particles in the resist solution L without performing dummy discharge when supplying the treatment solution as in the first embodiment. Accordingly, it is possible to efficiently suppress the increase of particles in the resist solution L without wastefully consuming the resist solution L. Further, when the resist solution L is discharged (supplied) from a treatment solution supply nozzle 7a to the wafer W after the idle state ends, the resist solution L can be supplied to the wafer W without performing circulation of the resist solution L by the solution treatment apparatus 5 as in the first embodiment. Therefore, the time required for the step of supplying the resist solution L to the wafer W can be reduced.

Sixth Embodiment

Figure 12:
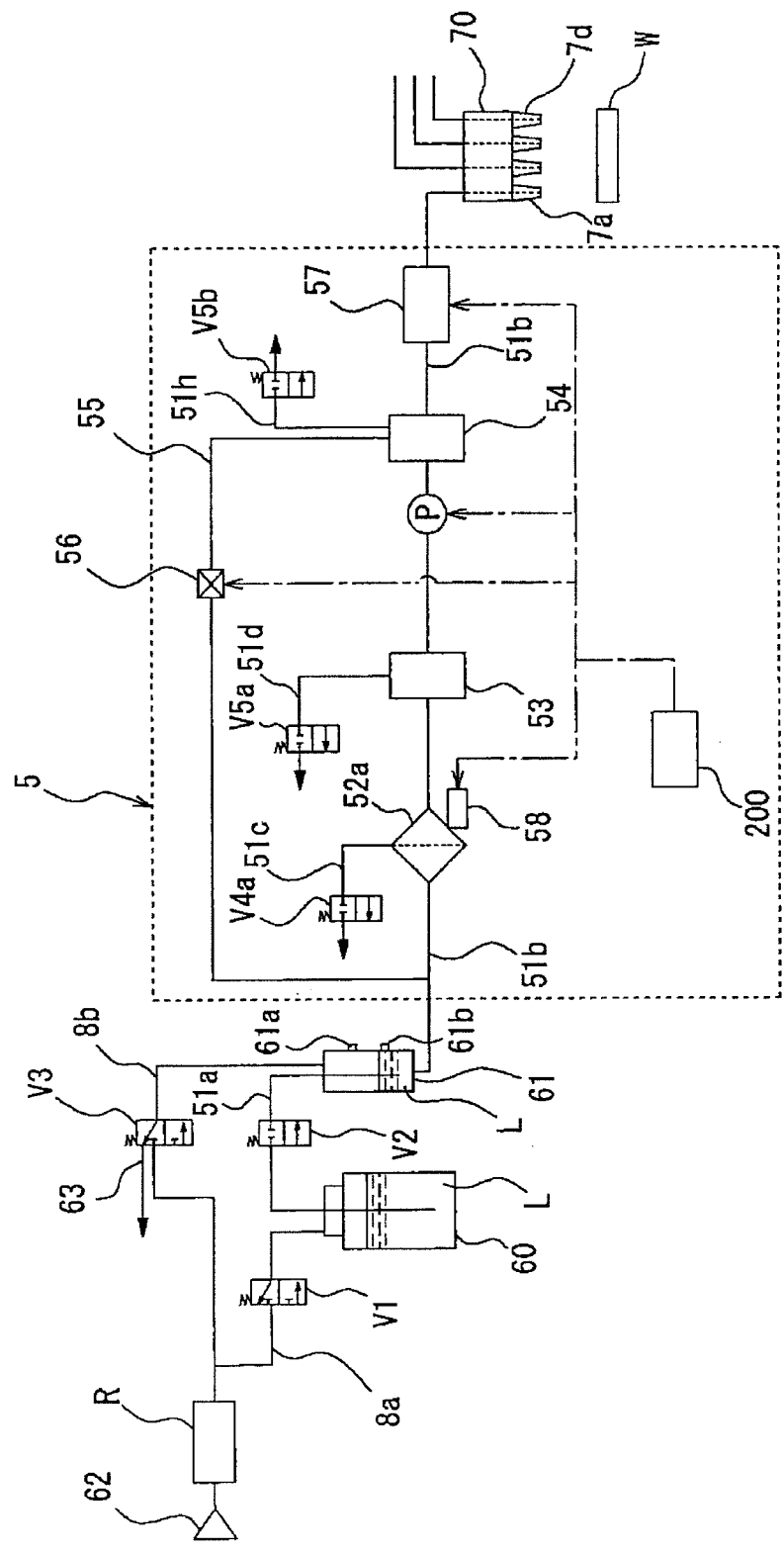
FIG. 12 A schematic cross-sectional view illustrating a sixth embodiment of the solution treatment apparatus according to this invention.
Figure 13:
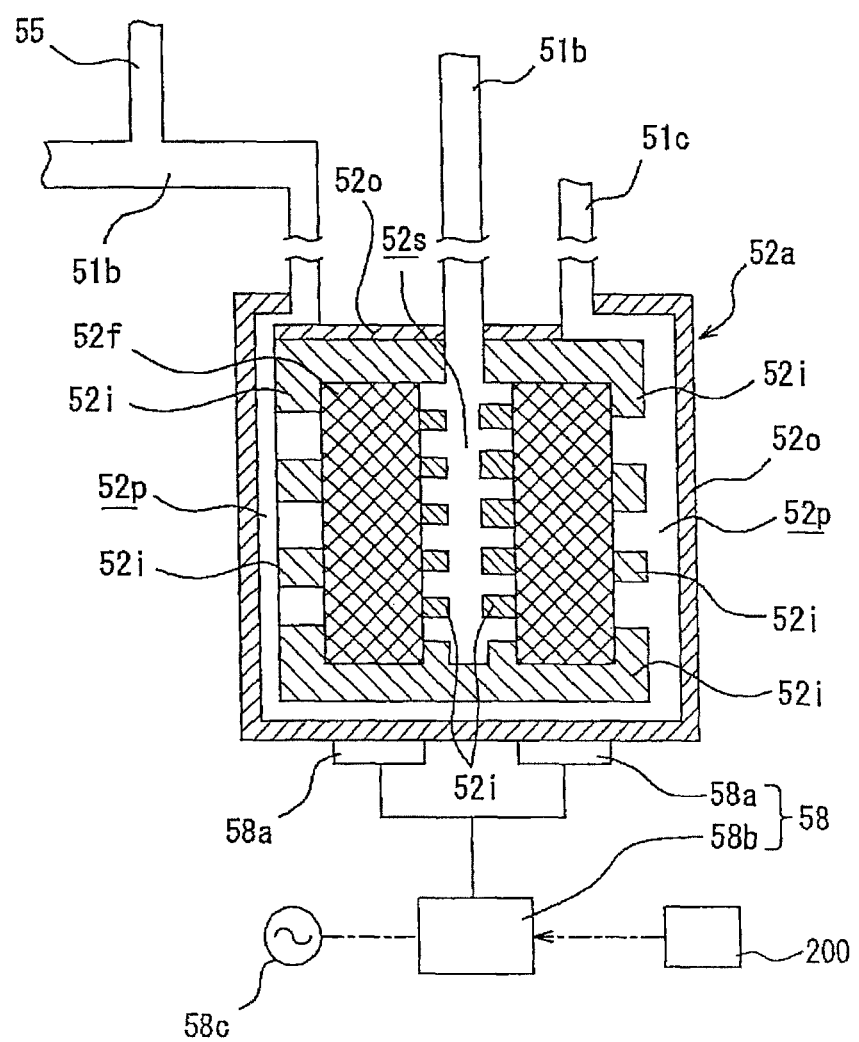
FIG. 13 An enlarged schematic cross-sectional view illustrating a part near a filter apparatus in the sixth embodiment of the solution treatment apparatus according to this invention.

A sixth embodiment of the solution treatment apparatus according to this invention will be described based on FIG. 12, FIG. 13. Note that the same reference numerals are given to the same components as those in the first embodiment to omit description thereof in the sixth embodiment.

A solution treatment apparatus 5 in the sixth embodiment has a vibrator 58 that ultrasonically vibrates a treatment solution in a filter apparatus 52a. In this case, as illustrated in FIG. 13, the vibrator 58 is mainly composed of, for example, a vibration plate 58a bonded to a bottom surface of the filter apparatus 52a, and an ultrasonic generator 58b that drives the vibration plate 58a and includes an ultrasonic power supply 58c. The ultrasonic generator 58b is electrically connected to a controller 200 and controlled in driving based on a control signal from the controller 200. Further, as the vibrator 58, for example, an ultrasonic vibrator is used.

Inside the filter apparatus 52a, a filter 52f for removing foreign matters is provided. Application of vibration of the vibration plate 58a based on the control signal from the controller 200 to the filter 52f makes it possible to prevent the resist solution L from staying in the filter 52f and efficiently prevent the increase of particles in the resist solution L staying in the filter 52f.

The above configuration makes it possible, even in the idle state, to suppress the increase of particles in the resist solution L without performing dummy discharge when supplying the treatment solution, as in the first embodiment. Accordingly, it is possible to efficiently suppress the increase of particles in the resist solution L without wastefully consuming the resist solution L. Further, when the resist solution L is discharged (supplied) from a treatment solution supply nozzle 7a to the wafer W after the idle state ends, the resist solution L can be supplied to the wafer W without performing circulation of the resist solution L by the solution treatment apparatus 5 as in the first embodiment. Therefore, the time required for the step of supplying the resist solution L to the wafer W can be reduced.

Seventh Embodiment

Figure 14:
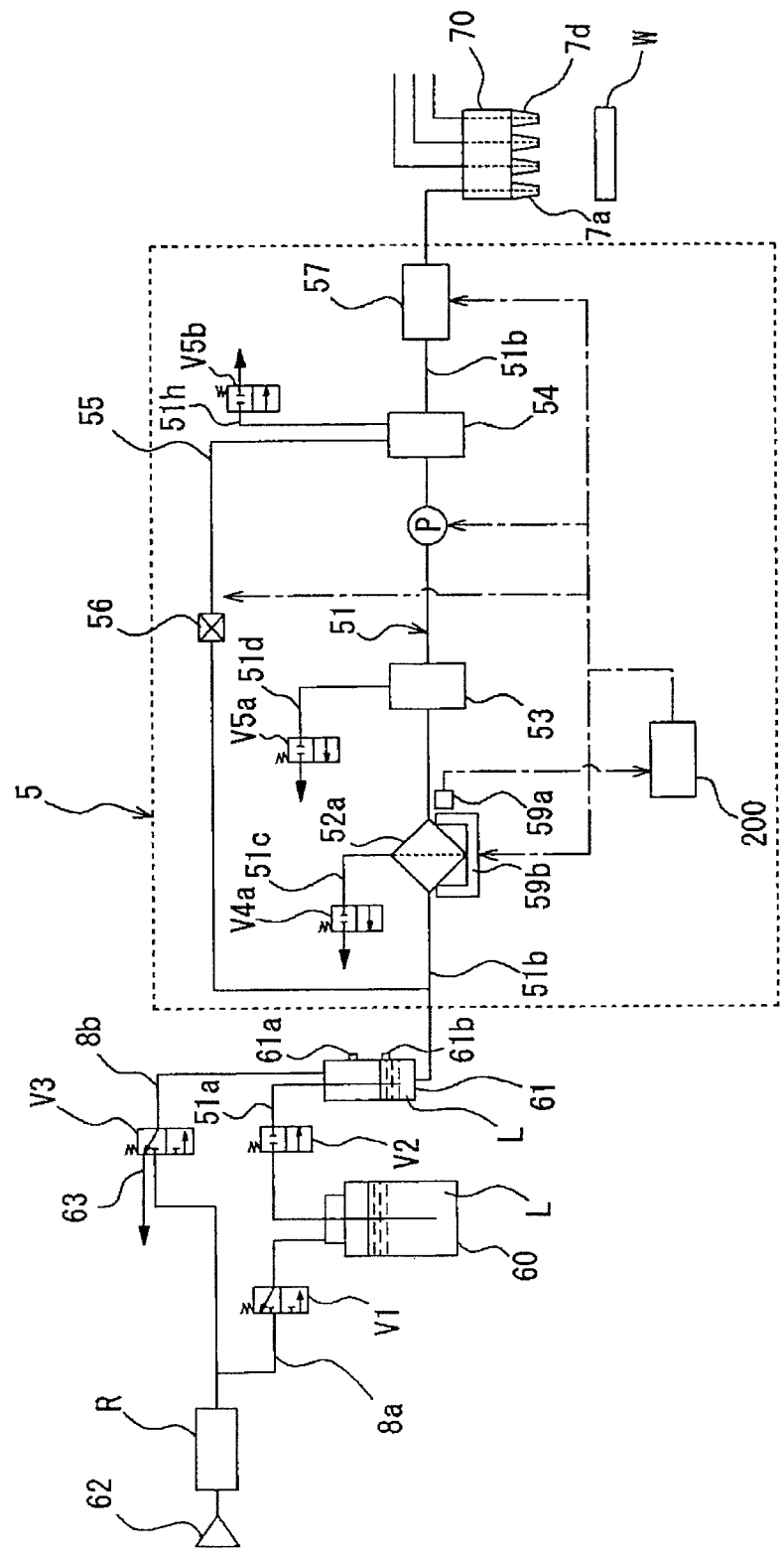
FIG. 14 A schematic cross-sectional view illustrating a seventh embodiment of the solution treatment apparatus according to this invention.
Figure 15:
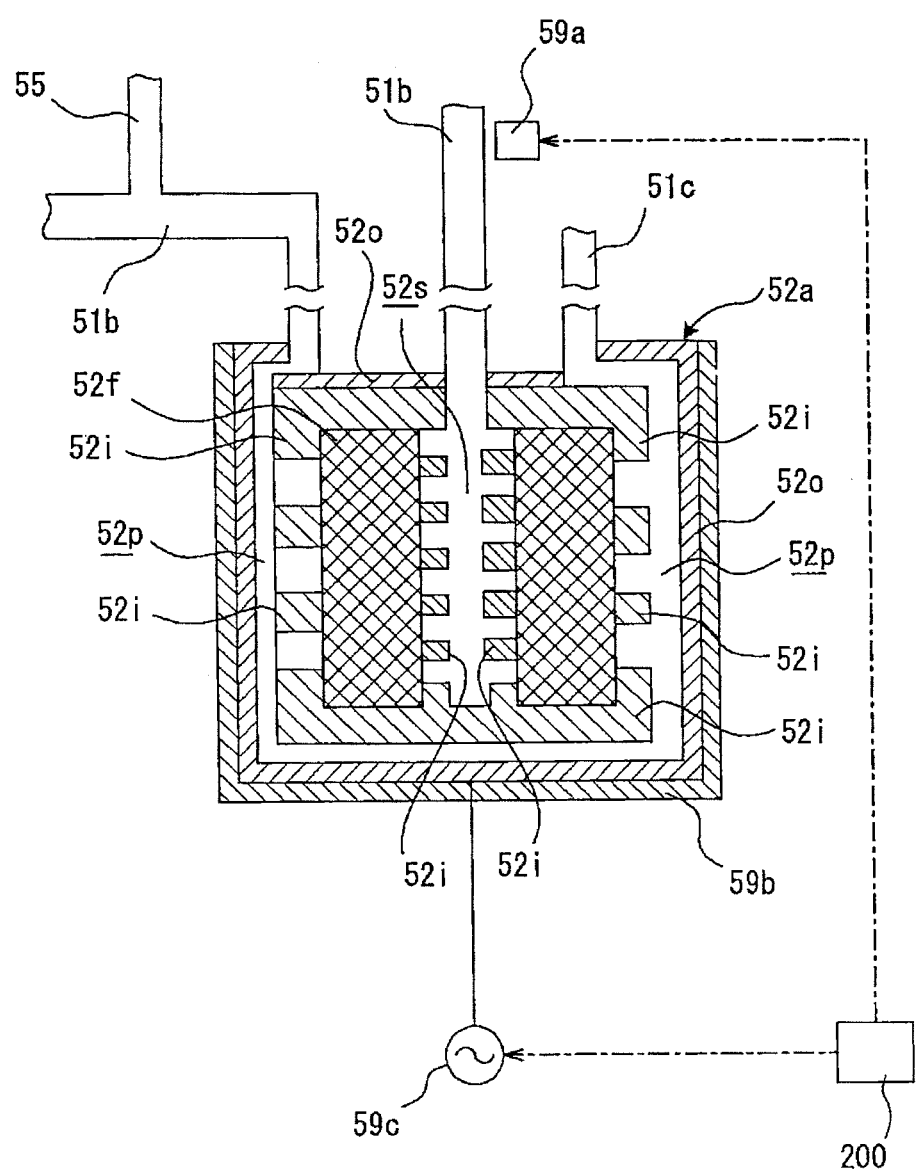
FIG. 15 An enlarged schematic cross-sectional view illustrating a part near a filter apparatus in the seventh embodiment of the solution treatment apparatus according to this invention.

A seventh embodiment of the solution treatment apparatus according to this invention will be described based on FIG. 14, FIG. 15. Note that the same reference numerals are given to the same components as those in the first embodiment to omit description thereof in the seventh embodiment.

A solution treatment apparatus 5 in the seventh embodiment has a temperature sensor 59a that detects the temperature of the resist solution L in a filter apparatus 52a and a temperature regulator 59b as a temperature control device that controls the temperature of the resist solution L in the filter apparatus 52a, which are arranged in addition to the solution treatment apparatus in the first embodiment. The temperature sensor 59a is provided in a second treatment solution supply pipeline 51b on the secondary side of the filter apparatus 52a. Further, the temperature regulator 59b is attached so as to cover the filter apparatus 52a. The temperature sensor 59a, the temperature regulator 59b, and a temperature regulation power supply 59c are connected to a controller 200. As the temperature sensor 59a, for example, a thermistor is used. Further, as the temperature regulator 59b, for example, a thermocouple is used.

As for the temperature control, the temperature regulator 59b conducts control of increasing the temperature of the resist solution L in the filter apparatus 52a to 40° C. by a control signal transmitted from the controller 200 to the temperature regulator 59b when the temperature of the resist solution L in the filter apparatus 52a detected by the temperature sensor 59a is a predetermined temperature, for example, 22° C. or lower.

The above configuration makes it possible to detect the temperature of the resist solution L staying in the filter apparatus 52a and control the temperature of the resist solution L by the temperature regulator 59b and the controller 200, and thereby keep the viscosity of the resist solution L due to temperature at a predetermined value or less so as to inhibit the resist solution L from staying in the filter apparatus 52a. Therefore, it is possible to efficiently prevent the increase of particles in the resist solution L staying in the filter apparatus 52a.

Further, the above configuration makes it possible, even in the idle state, to suppress the increase of particles in the resist solution L without performing dummy discharge when supplying the treatment solution, as in the first embodiment. Accordingly, it is possible to efficiently suppress the increase of particles in the resist solution L without wastefully consuming the resist solution L. Further, when the resist solution L is discharged (supplied) from a treatment solution supply nozzle 7a to the wafer W after the idle state ends, the resist solution L can be supplied to the wafer W without performing circulation of the resist solution L by the solution treatment apparatus 5 as in the first embodiment. Therefore, the time required for the step of supplying the resist solution L to the wafer W can be reduced.

Eighth Embodiment

Figure 16:
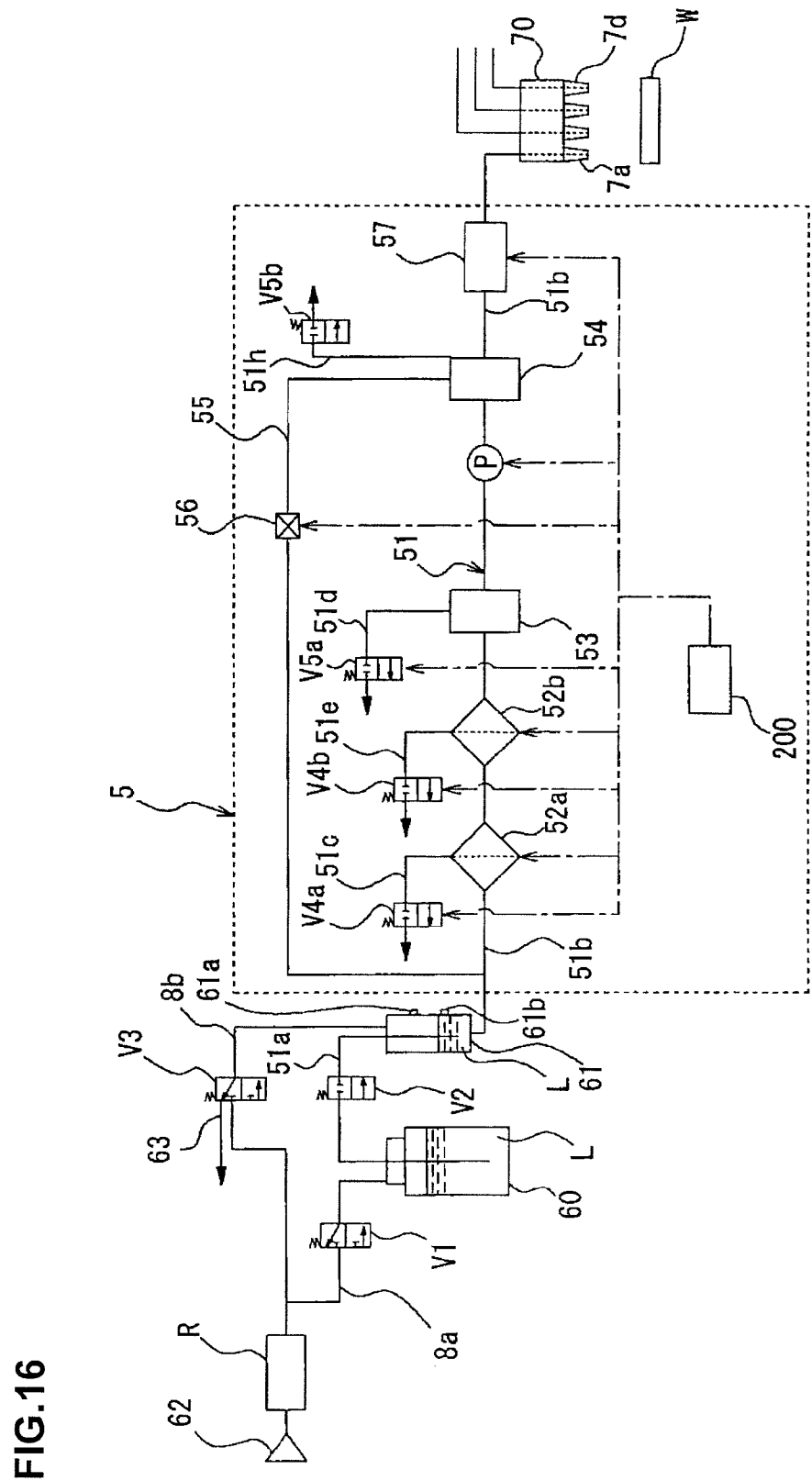
FIG. 16 A schematic cross-sectional view illustrating an eighth embodiment of the solution treatment apparatus according to this invention.

An eighth embodiment of the solution treatment apparatus according to this invention will be described based on FIG. 16. Note that the same reference numerals are given to the same components as those in the first embodiment to omit description thereof in the eighth embodiment.

A solution treatment apparatus 5 in the eighth embodiment has a plurality of, for example, two filter apparatuses connected in series, one of which is provided in the solution treatment apparatus 5 in the first embodiment. To the tops of filter apparatuses 52a, 52b, drain pipes 51c, 51e are provided for discharging atmospheres in the filter apparatuses 52a, 52b, and the drain pipes 51c, 51e are provided with electromagnetic opening/closing valves V4a, V4b. Though the two filter apparatuses 52a, 52b are connected in series in the eighth embodiment, three or more filter apparatuses may be connected in series. Note that since the other components in the eighth embodiment are the same as those in the first embodiment, and therefore the same reference numerals are given to the same components to omit description.

The above configuration makes it possible to remove more foreign matters (particles and bubbles) than in the case where one filter apparatus 52a is provided in the second treatment solution supply pipeline 51b.

Further, the above configuration makes it possible, even in the idle state, to suppress the increase of particles in the resist solution L without performing dummy discharge when supplying the treatment solution, as in the first embodiment. Accordingly, it is possible to efficiently suppress the increase of particles in the resist solution L without wastefully consuming the resist solution L. Further, when the resist solution L is discharged (supplied) from a treatment solution supply nozzle 7a to the wafer W after the idle state ends, the resist solution L can be supplied to the wafer W without performing circulation of the resist solution L by the solution treatment apparatus 5 as in the first embodiment. Therefore, the time required for the step of supplying the resist solution L to the wafer W can be reduced.

Ninth Embodiment

Figure 17:
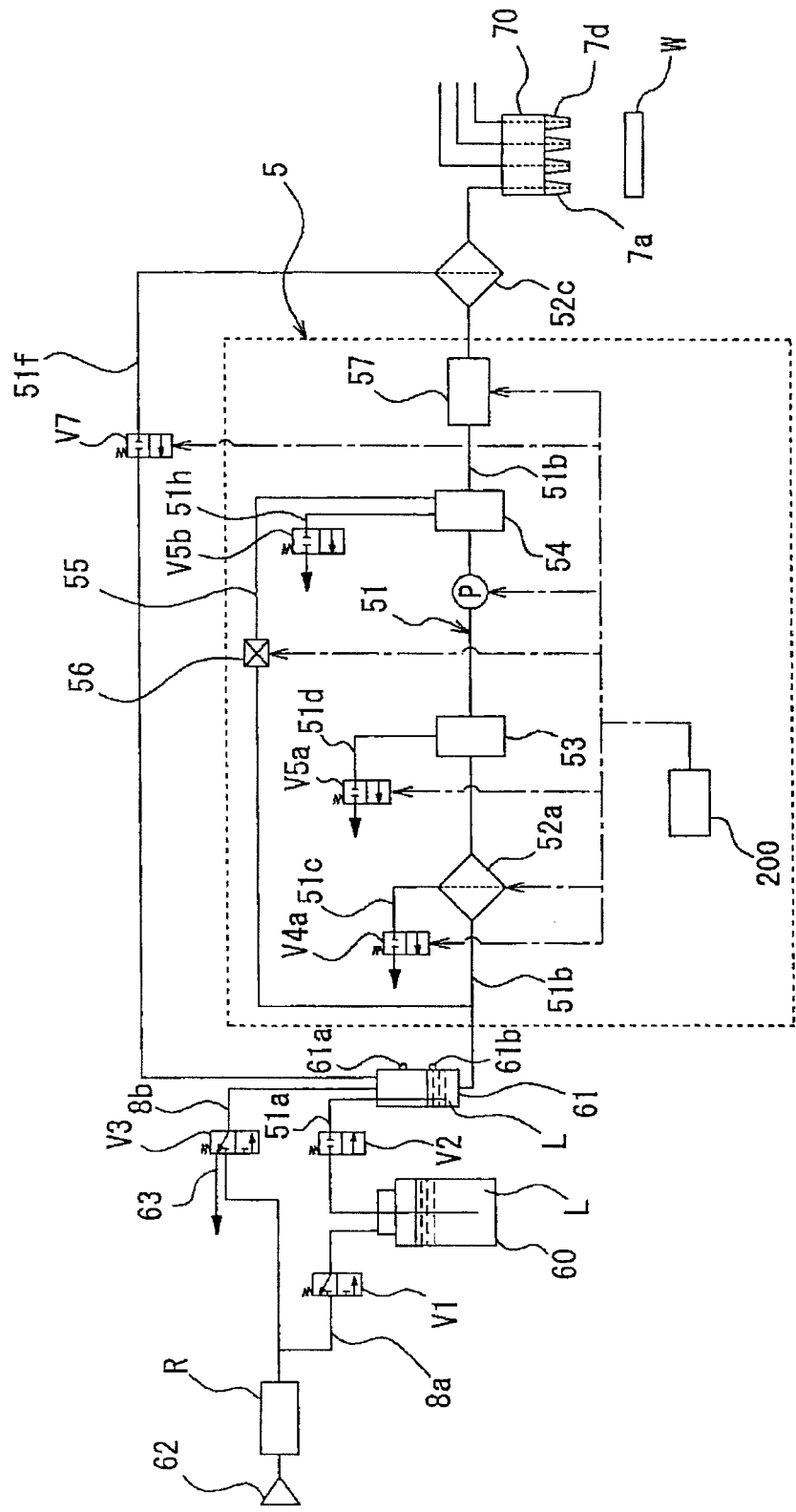
FIG. 17 A schematic cross-sectional view illustrating a ninth embodiment of the solution treatment apparatus according to this invention.

A ninth embodiment of the solution treatment apparatus according to this invention will be described based on FIG. 17. Note that the same reference numerals are given to the same components as those in the first embodiment to omit description thereof in the ninth embodiment.

A solution treatment apparatus 5 in the ninth embodiment has a filter apparatus 52c provided in a second treatment solution supply pipeline 51b on the secondary side of a supply control valve 57 in addition to the solution treatment apparatus 5 in the first embodiment. In other words, the filter apparatus 52c is provided in the second treatment solution supply pipeline 51b near a treatment solution supply nozzle 7a. Further, at the top of the filter apparatus 52c, a return pipeline 51f is formed which returns bubbles separated by the filter apparatus 52c back to a buffer tank 61. The return pipeline 51f is connected to the top of the buffer tank 61.

Further, the return pipeline 51f is provided with an electromagnetic opening/closing valve V7, and the opening/closing valve V7 is opened/closed by a control signal from a controller 200. Note that since the other components in the ninth embodiment are the same as those in the first embodiment, and therefore the same reference numerals are given to the same components to omit description thereof.

The above configuration allows the resist solution L to pass through the filter apparatus 52c when the resist solution L is supplied (discharged) to the wafer W, thereby making it possible to remove foreign matters (particles and bubbles) in the resist solution L which cannot be removed by a filter apparatus 52a, a first trap tank 53, and a second trap tank 54.

Further, the above configuration makes it possible, even in the idle state, to suppress the increase of particles in the resist solution L without performing dummy discharge when supplying the treatment solution as in the first embodiment. Accordingly, it is possible to efficiently suppress the increase of particles in the resist solution L without wastefully consuming the resist solution L. Further, when the resist solution L is discharged (supplied) from the treatment solution supply nozzle 7a to the wafer W after the idle state ends, the resist solution L can be supplied to the wafer W without performing circulation of the resist solution L by the solution treatment apparatus 5 as in the first embodiment. Therefore, the time required for the step of supplying the resist solution L to the wafer W can be reduced.

Tenth Embodiment

A tenth embodiment of the solution treatment apparatus according to this invention will be described based on FIG. 18 to FIG. 21.

Figure 18:
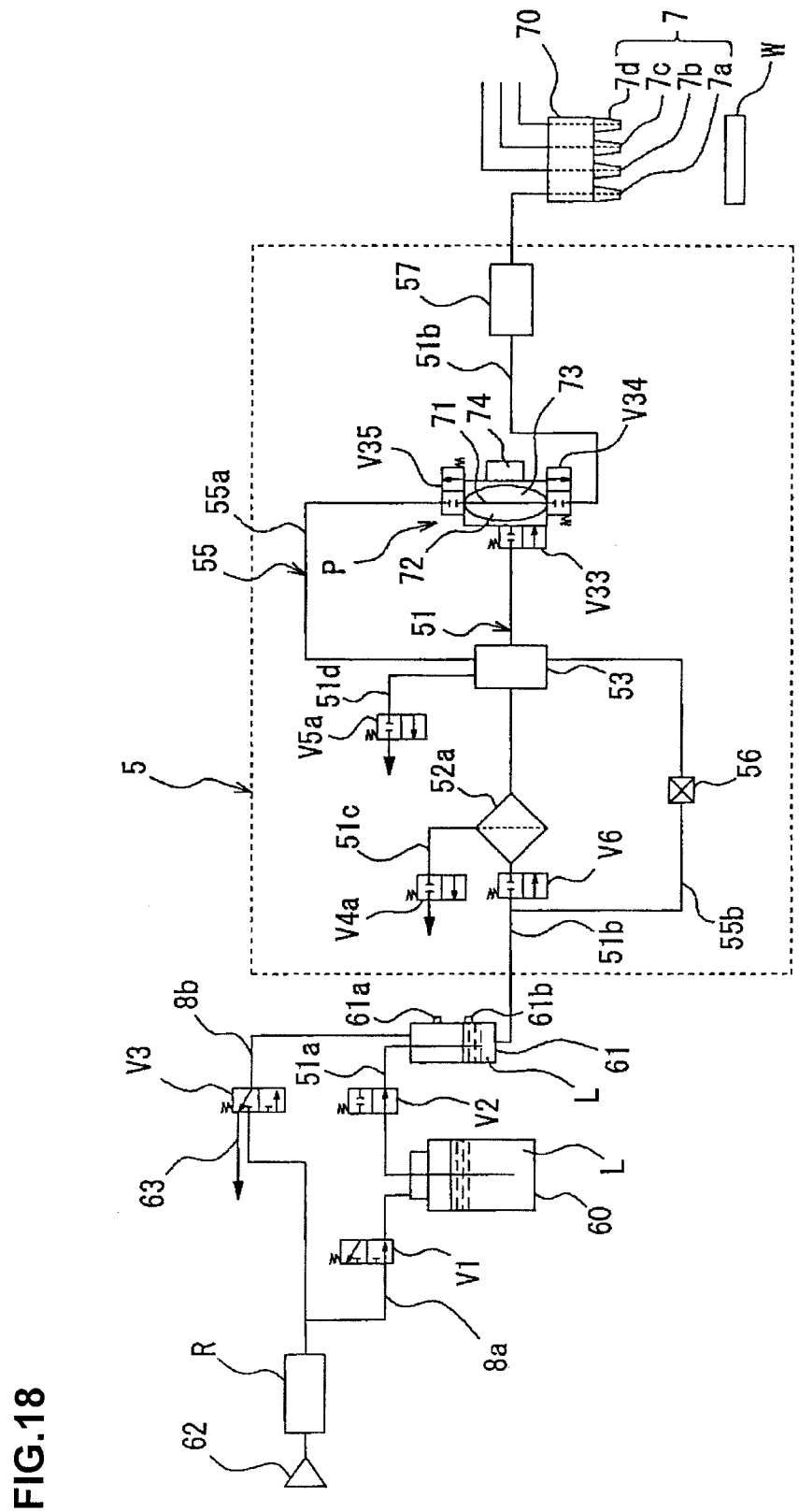
FIG. 18 A schematic cross-sectional view illustrating a tenth embodiment of the solution treatment apparatus according to this invention.

A solution treatment apparatus 5 illustrated in FIG. 18 has a third opening/closing valve V6 provided in a second treatment solution supply pipeline 51b on the primary side of a filter apparatus 52a and on the secondary side of a connection portion with a second circulation pipeline 55b. Further, in the tenth embodiment, a not-illustrated level sensor is provided which senses the liquid level of the resist solution L stored in a first trap tank 53.

Figure 19:
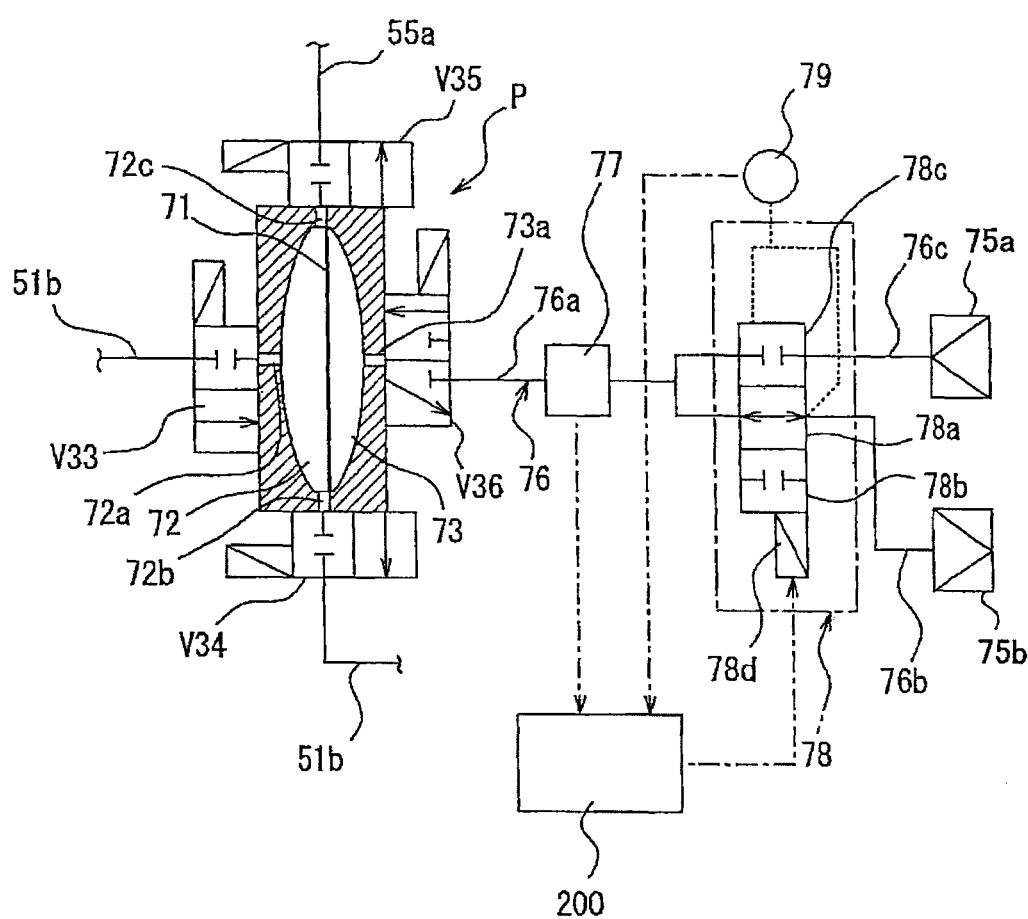
FIG. 19 An enlarged schematic cross-sectional view illustrating a part near a pump in the tenth embodiment of the solution treatment apparatus according to this invention.

As illustrated in FIG. 19, the pump P is partitioned into a pump chamber 72 corresponding to a pump portion and an operating chamber 73 corresponding to a driving portion by a diaphragm 71 being a flexible member. The pump chamber 72 is provided with a primary side communication passage 72a connected to the filter apparatus 52a side, a secondary side communication passage 72b connected to a treatment solution supply nozzle 7a side via a first opening/closing valve V34, and a circulation and exhaust side communication passage 72c connected to a first circulation pipeline 55a via a second opening/closing valve V35.

Further, to the operating chamber 73, a driving means is connected. More specifically, a supply and discharge path 73a communicating with the operating chamber 73 is provided and connected with a pipeline 76 which selectively communicates with an air pressurization source 75a (hereinafter, referred to as a pressurization source 75a) and a depressurization source 75b via a supply and discharge switching valve V36. In this case, the pipeline 76 is composed of a main pipeline 76a connected to the operating chamber 73, an exhaust pipeline 76b branching off from the main pipeline 76a and connected to the depressurization source 75b, and a pressurization pipeline 76c connected to the pressurization source 75a. The main pipeline 76a is provided with a flow meter 77 being a flow rate sensor. A pressure regulating mechanism that regulates the exhaust pressure provided in the exhaust pipeline 76b and a pressure regulating mechanism that regulates the pressurization, namely, the air pressure provided in the pressurization pipeline 76c are constituted in a compound pressure regulating mechanism 78. In this case, the compound pressure regulating mechanism 78 is composed of an electropneumatic regulator that includes a common communication block 78a that selectively connects the exhaust pipeline 76b and the pressurization pipeline 76c, two stop blocks 78b, 78c that interrupt the communication between the common communication block 78a and the exhaust pipeline 76b or the pressurization pipeline 76c, and an electromagnetic switching part 78d that switches and operates the stop blocks 78b, 78c. Further, the compound pressure regulating mechanism 78 (hereinafter, referred to as an electropneumatic regulator 78) is provided with a pressure sensor 79 that detects the pressure in the operating chamber 73 to which the pipeline 76 is connected.

In a supply and discharge part for operation air connected to the operating chamber 73 side of the pump P configured as described above, each of the flow meter 77, the pressure sensor 79, and the electropneumatic regulator 78 constituting the driving means is electrically connected to a controller 200. In addition, they are formed such that the exhaust flow rate in the pipeline 76 detected by the flow meter 77 and the pressure in the pipeline 76 detected by the pressure sensor 79 are transmitted (inputted) to the controller 200, and the control signal from the controller 200 is transmitted (outputted) to the electropneumatic regulator 78.

Figure 20:
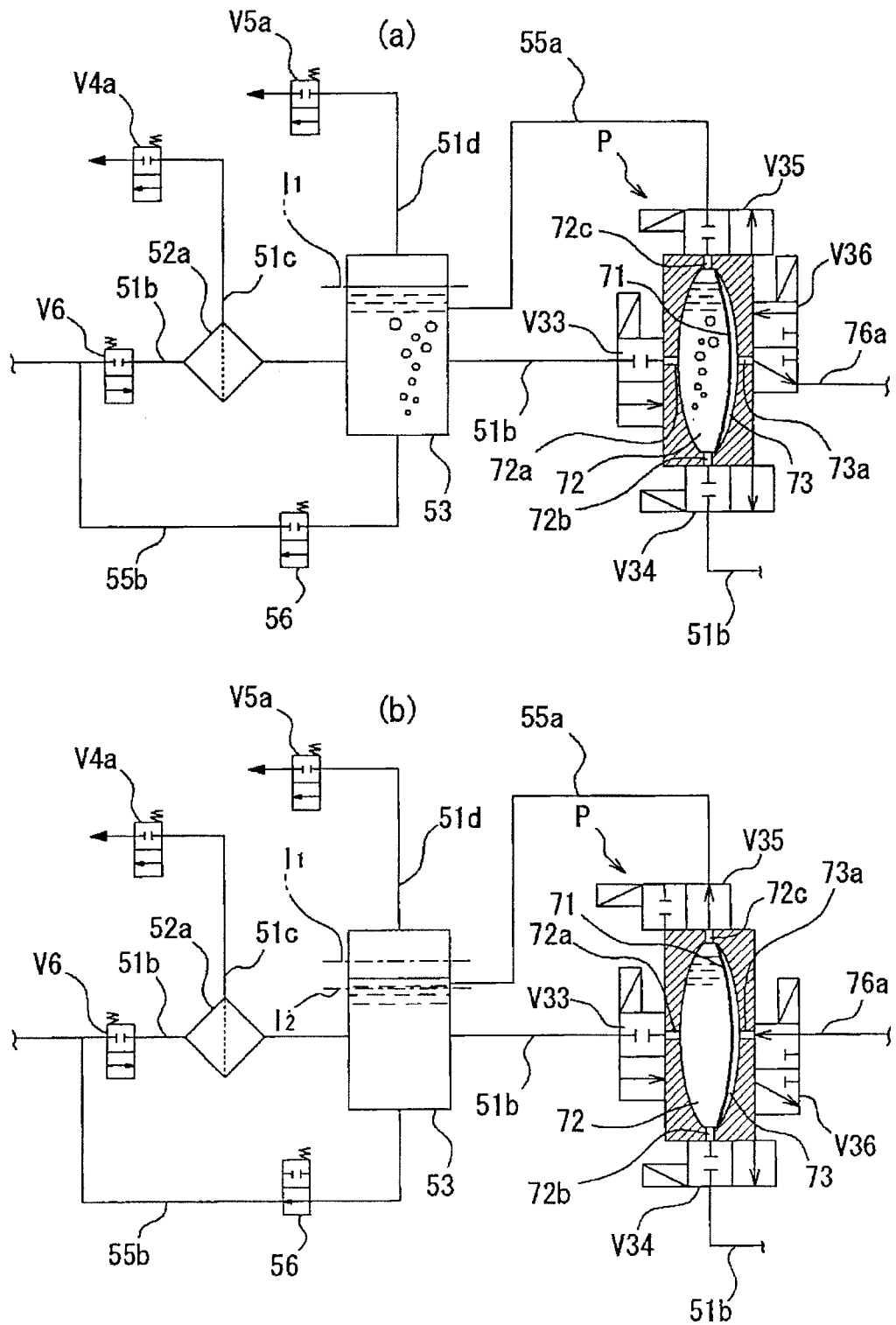
FIG. 20 A schematic view of the tenth embodiment of the solution treatment apparatus according to this invention, and (a) of FIG. 20 illustrating a bubble exposing step and (b) of FIG. 20 illustrating a degassing step.

Next, a step of exposing the gas in the resist solution L in the diaphragm pump and discharging the exposed gas to the outside will be explained based on FIG. 20, FIG. 21. Note that opening/closing valves V4a, V5a, an opening/closing valve V33 on an intake side, the first opening/closing valve V34, the second opening/closing valve V35, the supply and discharge switching valve V36, and a circulation control valve 56 perform opening/closing operations on the basis of the control signals from the controller 200 illustrated in FIG. 19.

As illustrated in FIG. 20(a), the first trap tank 53 is provided with a sensor line l1 that sets the upper limit of the storage amount of the resist solution L by a not-illustrated level sensor, and the third opening/closing valve V6 is closed when the resist solution L exceeds the sensor line l1, and thereby ends replenishment of the resist solution L to the pump chamber 72 and the first trap tank 53. In this event, a gas layer is formed at an upper part in the first trap tank 53 and the resist solution L is filled in the pump chamber 72.

Then, discharging the air in the operating chamber 73 with the opening/closing valve V33 on the intake side, the first opening/closing valve V34, the second opening/closing valve V35, the opening/closing valves V4a, V5a, and the circulation control valve 56 closed, brings the pump chamber 72 to a negative pressure. Bringing the pump chamber 72 to the negative pressure exposes fine bubbles existing in the resist solution L flowing into the pump chamber 72 (bubble exposing step). Since the gas in the treatment solution exposed by bringing the treatment solution sucked into the pump to the negative pressure in the bubble exposing step is discharged to the outside by the degassing step, the gas in the treatment solution can be surely removed, and the bubbles adhering to the filter can be easily removed by circulating the treatment solution.

Here, the bubble exposing step may discharge the air in the operating chamber 73 with the opening/closing valve V33 on the intake side opened and the first opening/closing valve V34, the second opening/closing valve V35, the opening/closing valves V4a, V5a, and the circulation control valve 56 closed. Discharging the air in the operating chamber 73 with the opening/closing valve V33 on the intake side opened makes it possible to reduce the displacement of the diaphragm pump P required to expose the bubbles in the resist solution L replenished in the pump chamber 72 and the first trap tank 53.

Here, the reason why discharging the air in the operating chamber 73 with the opening/closing valve V33 on the intake side opened makes it possible to reduce the displacement of the diaphragm pump P will be explained. When the volume of the pump chamber 72 is increased with discharge of the air in the operating chamber 73, the volumes of the resist solutions L in the pump chamber 72 and the first trap tank 53 rarely change, whereas the volume of the gas layer in the first trap tank 53 increases. Therefore, the pressure of the gas layer decreases with the increase in the volume. Further, the pressure of the resist solution L in contact with the gas layer balances with the pressure of the gas layer, so that the pressure of the resist solution L also decreases. Since the fine bubbles which can dissolve in the resist solution L decrease with the decrease in pressure of the resist solution L, the bubbles that cannot dissolve are exposed by the decrease in pressure of the resist solution L.

Accordingly, discharging the air in the operating chamber 73 with the opening/closing valve V33 on the intake side opened makes it possible to expose the fine bubbles existing in the resist solution L even by the diaphragm pump with a low displacement.

Then, as illustrated in FIG. 20(b), the electropneumatic regulator 78 is made to communicate with the pressurization side with the opening/closing valve V33 on the intake side closed, the second opening/closing valve V35 and the circulation control valve 56 opened, and the supply and discharge switching valve V36 switched to the pressurization source 75a side, to supply air into the operating chamber 73. Supplying air into the operating chamber 73 moves the bubbles exposed in the resist solution L flowing into the pump chamber 72 to the resist solution L stored in the first trap tank 53 (bubble moving step). Here, since the opening/closing valve V5a is closed, the bubbles moved to the first trap tank 53 form a gas layer at the upper part in the first trap tank 53 to pressurize the resist solution L in the first trap tank 53. Therefore, a part of the resist solution L stored in the first trap tank 53 flows through the second circulation pipeline 55b, and the storage amount of the resist solution L stored in the first trap tank 53 decreases.

Figure 21:
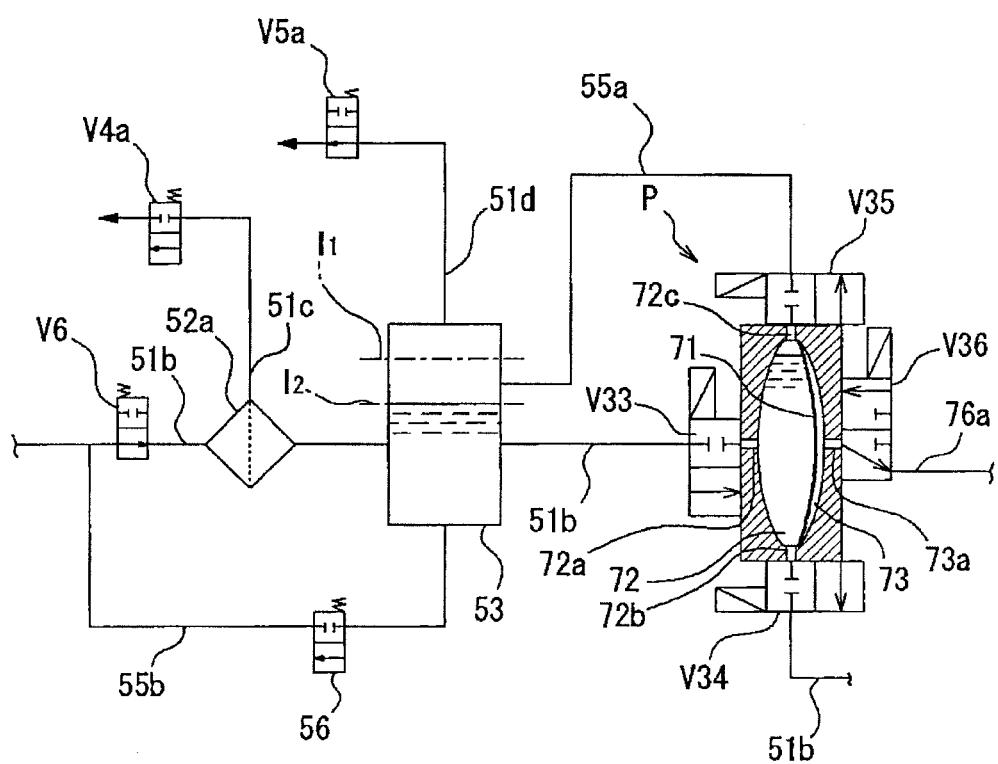
FIG. 21 A schematic view illustrating an operation of replenishing a treatment solution to a trap tank in the tenth embodiment of the solution treatment apparatus according to this invention.

When the storage amount of the resist solution L stored in the first trap tank 53 becomes equal to or less a sensor line l2 sensed by a not-illustrated level sensor by performing the bubble exposing step and the bubble moving step a plurality of times, the opening/closing valve V5a is opened with the circulation control valve 56 closed as illustrated in FIG. 21 to discharge the bubbles in the first trap tank 53 to the outside via the drain pipe 51d (degassing step). In this event, the third opening/closing valve V6 is opened and a part of the resist solution L stored in the buffer tank 61 flows into the first trap tank 53 via the second treatment solution supply pipeline 51b. The third opening/closing valve V6 is closed when the liquid level of the resist solution L flowing into the first trap tank 53 reaches the sensor line l1, with which the flow of the resist solution L into the first trap tank 53 ends.

The above configuration makes it possible to expose the gas existing in the resist solution L replenished into the pump P and degas the resist solution L. Therefore, it is possible to suppress mixture of gas into the resist solution L to be supplied to the resist solution L.

Further, since the bubble exposing step and the degassing step are repeated as described above, it becomes possible to efficiently remove the bubbles existing in the resist solution L stored in the pump chamber 72 and the first trap tank 53.

Eleventh Embodiment

Figure 22:
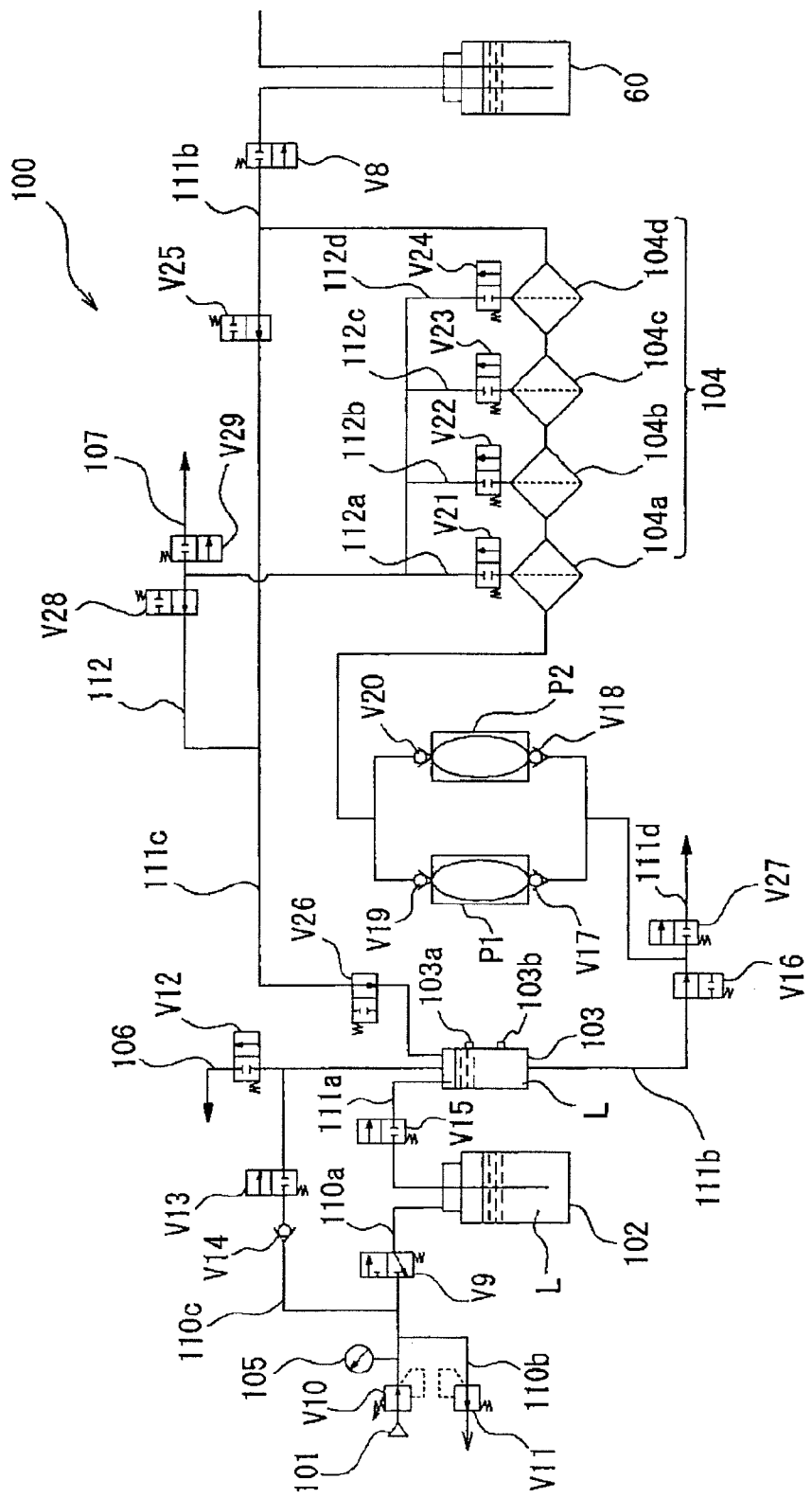
FIG. 22 A schematic cross-sectional view illustrating a solution treatment unit connected to the solution treatment apparatus according to this invention.

A solution treatment unit connected to the solution treatment apparatus according to this invention will be described based on FIG. 22. As illustrated in FIG. 22, a solution treatment unit 100 connected to a solution treatment apparatus 5 includes a nitrogen gas supply source 101 that supplies an inert gas, for example, a nitrogen gas ($N_2$), a resist container 102 that stores the resist solution L, a buffer tank 103 that temporarily stores the treatment solution led from the resist container 102, two pumps P1, P2 that discharge the resist solution L stored in the buffer tank 103, and four filter apparatuses 104a to 104d (hereinafter, represented by filter apparatuses 104) that are provided on the secondary side of the pumps P1, P2. In this embodiment, diaphragm pumps are used for the pumps P1, P2.

Further, a resist container 60 is provided on the secondary side of the filter apparatuses 104 via an electromagnetic opening/closing valve V8. On the secondary side of the resist container 60, a first treatment solution supply pipeline 51a, the solution treatment apparatus 5, a treatment solution supply nozzle 7 and so on which have been described in the first embodiment to the tenth embodiment are provided.

On the primary side of the resist container 102, a third gas supply pipeline 110a connected to the nitrogen gas supply source 101 is provided. Between the nitrogen gas supply source 101 and the resist container 102 in the third gas supply pipeline 110a, an electromagnetic switching valve V9 is provided. Further, between the nitrogen gas supply source 101 and the resist container 102 in the third gas supply pipeline 110a, a pressure control valve V10 is provided and a pressure gauge 105 is provided. Further, between the pressure control valve V10 and the switching valve V9 in the third gas supply pipeline 110a, a gas drain pipeline 110b is connected, and a relief valve V11 is provided in the gas drain pipeline 110b.

Further, on the primary side of the resist container 102, a fourth gas supply pipeline 110c is provided which has one end branching off from the third gas supply pipeline 110a and another end connected to the top of the buffer tank 103. The fourth gas supply pipeline 110c is provided with an opening/closing valve V12 that communicates, in a switchable manner, the inside of a buffer tank 103 with an atmosphere part 106 opening to the atmosphere or with the nitrogen gas supply source 101. Further, the fourth gas supply pipeline 110c is provided with an electromagnetic opening/closing valve V13 and a check valve V14.

On the secondary side of the resist container 102, a third treatment solution supply pipeline 111a connected to the buffer tank 103 is provided. The third treatment solution supply pipeline 111a is provided with an electromagnetic opening/closing valve V15.

On the secondary side of the buffer tank 103, a fourth treatment solution supply pipeline 111b is provided. The fourth treatment solution supply pipeline 111b is provided with electromagnetic opening/closing valves V8, V16, the pumps P1, P2, the filter apparatuses 104, and the resist container 60. The pumps P1, P2 are provided in parallel with each other in the fourth treatment solution supply pipeline 111b on the primary side of the filter apparatuses 104, and check valves V17 to V20 are provided on the primary side and the secondary side of the pumps. Note that to the secondary side of the opening/closing valve V16 in the fourth treatment solution supply pipeline 111b connecting the opening/closing valve V16 and the pumps P1, P2, a drain pipeline 111d having an opening/closing valve V27 is connected.

Further, the filter apparatuses 104a to 104d are provided in series in the fourth treatment solution supply pipeline 111b on the secondary side of the pumps P1, P2. At the tops of the filter apparatuses 104a to 104d, drain pipelines 112a to 112d are provided, and electromagnetic opening/closing valves V21 to V24 corresponding to the respective filter apparatuses 104a to 104d are provided in the drain pipelines 112a to 112d.

From the fourth treatment solution supply pipeline 111b on the secondary side of the filter apparatuses 104, a return pipeline 111c branches off. The return pipeline 111c is connected to the top of the buffer tank 103. Further, to the return pipeline 111c, a drain pipeline 112 is connected. Further, the return pipeline 111c is provided with electromagnetic opening/closing valves V25, V26.

The drain pipeline 112 is provided with an electromagnetic opening/closing valve V28. The drain pipeline 112 on the primary side of the opening/closing valve V28 is provided with an electromagnetic opening/closing valve V29 that communicates the resist solution L supplied via the filter apparatuses 104, in a switchable manner, with the drain via the atmosphere part 107 or the return pipeline 111c.

The opening/closing valves V12, V29 and the opening/closing valves V13, V15, V16, V21 to V28 are electrically connected to a not-illustrated controller, and configured to perform switching operations and opening/closing operations on the basis of the control signals from the controller. Note that the buffer tank 103 is provided with an upper limit liquid level sensor 103a and a lower limit liquid level sensor 103b similarly to the buffer tank 61, and are formed such that the signals sensed by the upper limit liquid level sensor 103a and the lower limit liquid level sensor 103b are transmitted to the not-illustrated controller.

Next, the operation aspect of the solution treatment unit will be explained.

Resist Solution Supply to Buffer Tank

First, the resist container 102 is set, and then the switching valve V9 provided in the third gas supply pipeline 110a and the opening/closing valve V15 provided in the third treatment solution supply pipeline 111a are opened based on the control signals from the not-illustrated controller, to supply the resist solution L into the buffer tank 103 by pressurization of the nitrogen gas supplied from the nitrogen gas supply source 101 into the resist container 102. In this event, the opening/closing valve V12 has been switched to the atmosphere part 106 side and the inside of the buffer tank 103 has been communicated with the atmosphere. At the time when the resist solution L supplied from the resist container 102 is supplied (replenished) to the buffer tank 103 via the third treatment solution supply pipeline 111a, the resist solution L comes into contact with the gas (atmosphere) in the buffer tank 103, whereby the resist solution L increases in area in contact with the atmosphere to expose the gas existing in the resist solution L to thereby generate bubbles or facilitate generation of bubbles.

Circulation of Resist Solution

Next, circulation of the resist solution L performed through the fourth treatment solution supply pipeline 111b and the return pipeline 111c will be described. When a predetermined amount of the resist solution L has been supplied (replenished) into the buffer tank 103, the opening/closing valve V15 is closed and the opening/closing valve V16 is opened based on the control signals from the not-illustrated controller that has received the sensing signal from the upper limit liquid level sensor 103a.

At the time when circulating the resist solution L, the pumps P1, P2 are alternately driven to cause the resist solution L stored in the buffer tank 103 to flow into the return pipeline 111c via the filter apparatuses 104. Further, the resist solution L flowed into the return pipeline 111c flows into the buffer tank 103. Accordingly, the resist solution L is circulated between the fourth treatment solution supply pipeline 111b and the return pipeline 111c, whereby the resist solution L from which the particles and bubbles have been removed by passing through the filter apparatuses 104 is stored in the buffer tank 103.

Nitrogen Gas Pressurization—Supply to Resist Container of Resist Solution

Supply of the resist solution L from the buffer tank 103 to the resist container 60 will be explained. In the case of supplying the resist solution L from the buffer tank 103 to the resist container 60, the switching valve V9 and the opening/closing valve V15 are closed and the opening/closing valve V13 is opened based on the control signals from the not-illustrated controller, and the opening/closing valve V13 switches over to the nitrogen gas supply source 101 side. Thus, the nitrogen gas is supplied from the nitrogen gas supply source 101 into the buffer tank 103, whereas the opening/closing valves V8, V16 in the fourth treatment solution supply pipeline 111b are opened and the pumps P1, P2 are driven to supply the resist solution L to the filter apparatuses 104 and the resist container 60. In this event, the bubbles dissolved in the filter apparatuses 104 are discharged to the atmosphere part 107 via the drain pipelines 112a to 112d. Further, the resist solution L supplied to the resist container 60 is discharged (supplied) from the treatment solution supply nozzle 7a to the wafer W or the resist solution L circulates between the supply pipeline 51 and the circulation pipeline 55 as described above in the first embodiment.

Since the configuration that the four filter apparatuses 104a to 104d are provided in the fourth treatment solution supply pipeline 111b is provided as described above, the time required for filtrating the resist solution L stored in the buffer tank 103 becomes a quarter of that in the case of using only one filter apparatus. Therefore, the time required for removing the particles and bubbles in the resist solution L by circulation of the resist solution L can be reduced.

Other Embodiments

Note that the case that the treatment solution supply apparatus according to this invention is applied to the resist coating treatment apparatus has been described in the above embodiments, but the treatment solution supply apparatus is also applicable to a supply apparatus for the treatment solution other than the resist, for example, a developing solution or the like and to a supply apparatus for a cleaning treatment.

Further, it is possible to form an embodiment made by incorporating at least one of the second embodiment to the tenth embodiment into the first embodiment. This can doubly prevent increase of particles in the resist solution L without wastefully consuming the resist solution L.

EXPLANATION OF CODES 5 solution treatment apparatus
7, 7a to 7d treatment solution supply nozzle
51 supply pipeline
51a first treatment solution supply pipeline
51b second treatment solution supply pipeline
52a filter apparatus
53 first trap tank
54 second trap tank
55 circulation pipeline
56 circulation control valve
57 supply control valve
58 vibrator
59a temperature sensor
59b temperature regulator
60 resist container
61 buffer tank
71 diaphragm
72 pump chamber
73 operating chamber
80 degassing mechanism
81 container
82 semipermeable membrane tube
83 inflow port
84 outflow port
85 exhaust port
86 discharge pipe
200 controller
L resist solution
P pump
V6 third opening/closing valve
V31, V32 opening/closing valve
V33 opening/closing valve on intake side
V34 first opening/closing valve
V35 second opening/closing valve
V36 supply and discharge switching valve
V4a, V5a opening/closing valve
W wafer

What is claimed:

1. A solution treatment method using a solution treatment apparatus,
the solution treatment apparatus comprising:
a supply pipeline that connects a treatment solution storage container that stores a treatment solution and a treatment solution supply nozzle that supplies the treatment solution to a substrate to be treated;
a filter apparatus that is provided in the supply pipeline, and filtrates the treatment solution and removes foreign matters mixed in the treatment solution;
a pump that is provided in the supply pipeline on a secondary side of the filter apparatus;
a trap tank that is provided in the supply pipeline between the filter apparatus and the pump and has a function of separating bubbles existing in the treatment solution,
a circulation pipeline that comprises a first circulation pipeline connecting the trap tank and the pump, and a second circulation pipeline connecting the trap tank and the supply pipeline on the primary side of the filter apparatus;
a supply control valve that is provided in the supply pipeline on a secondary side of the pump;
a circulation control valve that is provided in the circulation pipeline; and
a control unit that controls the pump, the supply control valve, and the circulation control valve,
the solution treatment method comprising:
a treatment solution supply step of supplying the treatment solution to the substrate to be treated by opening the supply control valve and closing the circulation control valve and driving the pump; and a circulation step of circulating the treatment solution between the circulation pipeline and the supply pipeline by closing the supply control valve and opening the circulation control valve and driving the pump when the treatment solution supply step is not performed.

2. The solution treatment method according to claim 1, wherein a degassing mechanism configured to degas the treatment solution i-s-provided in the circulation pipeline or the supply pipeline that circulate the treatment solution in the circulation step, and wherein the circulation step comprises a degassing step of degassing the treatment by the degassing mechanism.

3. The solution treatment method according to claim 1, wherein the pump is composed of a diaphragm pump that drives a diaphragm partitioning a pump portion and a driving portion, to reciprocate by drive of a driving means, wherein on an intake side of the diaphragm pump, an opening/closing valve on an intake side that selectively enables inflow of the treatment solution into the pump portion is provided, wherein on a discharge side of the diaphragm pump, a first opening/closing valve that selectively enables supply of the treatment solution to the treatment solution supply nozzle and a second opening/closing valve that selectively enables supply of the treatment solution to the circulation pipeline are provided, and a switching valve that selectively enables discharge of bubbles separated in the trap tank to an outside via a drain pipe is provided, wherein the circulation control valve is provided in the second circulation pipeline, and a third opening/closing valve is provided in the supply pipeline on the primary side of the filter apparatus and on a secondary side of a connection portion between the second circulation pipeline and the supply pipeline, wherein the solution treatment method further comprising:

a bubble exposing step of exposing fine bubbles existing in the treatment solution by bringing the pump portion to a negative pressure by the drive of the driving means with the first opening/closing valve, the second opening/closing valve, the opening/closing valve on the intake side, the switching valve, and the circulation control valve closed;

after the bubble exposing step, a bubble moving step of moving the exposed bubbles to the trap tank with the opening/closing valve on the intake side, the first opening/closing valve, and the third opening/closing valve closed and the second opening/closing valve and the circulation control valve opened; and a degassing step of discharging the bubbles in the trap tank to the outside via the drain pipe by closing the first opening/closing valve, the second opening/closing valve, and the circulation control valve and opening the opening/closing valve on the intake side, the third opening/closing valve, and the switching valve, wherein the bubble exposing step, the bubble moving step, and the degassing step are performed after end of the treatment solution supply step and before start of the circulation step.

4. The solution treatment method according to claim 1, wherein the bubble exposing step is a step of exposing fine bubbles existing in the treatment solution by bringing the pump portion to the negative pressure by the drive of the driving means with the first opening/closing valve, the second opening/closing valve, the third opening/closing valve, the switching valve, and the circulation control valve closed and the opening/closing valve on the intake side opened.

* * * * *